United States Patent
Forghani-zadeh et al.

(10) Patent No.: US 11,251,795 B2
(45) Date of Patent: Feb. 15, 2022

(54) IC WITH FIRST AND SECOND FUNCTIONAL CIRCUITS COUPLING ONLY FIRST CIRCUITS TO OUTPUT BOND PADS

(71) Applicant: TEXAS INSTRUMENTS INCORPORATED, Dallas, TX (US)

(72) Inventors: H. Pooya Forghani-zadeh, Dallas, TX (US); George Vincent Konnail, Addison, TX (US); Christopher Adam Opoczynski, Irving, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/875,384

(22) Filed: May 15, 2020

(65) Prior Publication Data
US 2020/0280315 A1    Sep. 3, 2020

Related U.S. Application Data

(62) Division of application No. 15/635,998, filed on Jun. 28, 2017, now Pat. No. 10,693,468.

(51) Int. Cl.
*H03K 19/1776* (2020.01)
*H03K 19/173* (2006.01)
*H03K 19/0175* (2006.01)

(52) U.S. Cl.
CPC . *H03K 19/1776* (2013.01); *H03K 19/017509* (2013.01); *H03K 19/1737* (2013.01)

(58) Field of Classification Search
CPC ......... H03K 19/017509; H03K 19/173; H03K 19/1737; H03K 19/177; H03K 19/1776;
(Continued)

(56) References Cited

U.S. PATENT DOCUMENTS 4,825,438 A * 4/1989 Bennett ............... G06F 11/0751
                                                         710/100
5,546,553 A    8/1996 Robertson
(Continued)

FOREIGN PATENT DOCUMENTS

EP    1764921 A2    3/2007
WO   00/31620 A1   6/2000

OTHER PUBLICATIONS

European Search Report dated Jun. 17, 2020.
(Continued)

*Primary Examiner* — Jason Crawford
(74) *Attorney, Agent, or Firm* — Valerie M. Davis; Charles A. Brill; Frank D. Cimino

(57) ABSTRACT

A family of digital logic functions has the same specifications for input and output voltages and the same number of bond pads. A digital logic integrated circuit for the family includes a substrate of semiconductor material having a core area and a peripheral area; a certain number of bond pads formed in the peripheral area, the certain number of bond pads determining the total area of the substrate; programmable digital logic transistor circuitry formed in the core area for each of the digital logic functions in the family; programmable input and output circuitry formed in the peripheral area; programming circuitry for programming the programmable digital logic transistor circuitry into a selected digital logic function; and programmable input and output means for programming the input and output circuitry into input and output circuits for the selected digital logic function.

18 Claims, 18 Drawing Sheets

(58) Field of Classification Search
CPC ....... H03K 19/17704; H03K 19/17708; H03K 19/17712; H03K 19/17716; H03K 19/17724
USPC ............... 326/37–41, 47, 104, 112, 114
See application file for complete search history.

(56) References Cited

U.S. PATENT DOCUMENTS

| | | | |
|---|---|---|---|
| 5,587,607 A | 12/1996 | Yasuda | |
| 5,880,596 A | 3/1999 | White | |
| 6,097,212 A * | 8/2000 | Agrawal | H03K 19/1737 326/38 |
| 6,140,837 A | 10/2000 | Eaton | |
| 6,175,951 B1 | 1/2001 | Shyu | |
| 6,297,666 B1 | 10/2001 | Weingartner | |
| 6,525,560 B1 | 2/2003 | Trimberger | |
| 6,735,755 B2 * | 5/2004 | Shau | H01L 27/0207 257/203 |
| 6,774,667 B1 | 8/2004 | Chan | |
| 7,170,179 B1 | 1/2007 | Shah | |
| 7,202,701 B1 | 4/2007 | Chambers | |
| 7,213,221 B1 | 5/2007 | Celik | |
| 7,402,443 B1 | 7/2008 | Pang | |
| 7,509,594 B2 * | 3/2009 | Meir | G06F 30/00 716/137 |
| 7,616,025 B1 | 11/2009 | Irving | |
| 8,105,885 B1 | 1/2012 | Lee | |
| 8,289,051 B2 | 10/2012 | Turner | |
| 10,693,468 B2 * | 6/2020 | Forghani-zadeh | H03K 19/1776 |
| 2004/0012413 A1 | 1/2004 | Whetsel | |
| 2004/0128626 A1 | 7/2004 | Wingren | |
| 2005/0091629 A1 | 4/2005 | Eisenstadt | |
| 2006/0091907 A1 | 5/2006 | Khan | |
| 2007/0109009 A1 | 5/2007 | Whetsel | |
| 2008/0309370 A1 | 12/2008 | Spangaro | |
| 2009/0128188 A1 | 5/2009 | Madurawe | |
| 2009/0160482 A1 | 6/2009 | Karp | |
| 2012/0281449 A1 | 11/2012 | Kim | |
| 2012/0313664 A1 | 12/2012 | Thacker, III | |
| 2013/0300497 A1 * | 11/2013 | Zhang | H03K 19/177 327/564 |
| 2014/0167818 A1 * | 6/2014 | Eisenstadt | H01L 23/5225 326/101 |
| 2014/0266386 A1 | 9/2014 | Huang | |
| 2016/0079978 A1 | 3/2016 | Kinzer | |
| 2020/0067509 A1 * | 2/2020 | Brito | H01L 23/5286 |

OTHER PUBLICATIONS

Texas Instruments, "DesignWare NVM Databook," May 24, 2012.
Texas Instruments, "Little Logic Guide," 2014.
Texas Instruments, "Logic Guide," 2014.
Texas Instruments, "SNx4LVC374A Octal Edge-Triggered D-Type Flip-Flops With 3-State Outputs," Jul. 2014.
Texas Instruments, "SN74AUC2G08 Dual 2-Input Positive-AND Gate," Jan. 2007.
Texas Instruments, "SN74LVC1G00 Single 2-Input Positive-NAND Gate," Apr. 2014.
Texas Instruments, "SN74LVC1G02 Single 2-Input Positive NOR-Gate," Apr. 2014.
Texas Instruments, "SN74LVC1G04 Single Inverter Gate," Oct. 2014.
Texas Instruments, "SN74LVC1G08 Single 2-Input Positive-AND Gate," Apr. 2014.
Texas Instruments, "SN74LVC1G32 Single 2-Input Positive-OR Gate," Aug. 2015.
Texas Instruments, "Dissecting the TI Logic Data Sheet," Jun. 2016.
Texas Instruments, "SN74LVC1G79 Single Positive-Edge-Triggered D-Type Flip-Flop," Dec. 2013.
Texas Instruments, "SN74LVC1G86 Single 2-Input Exclusive-OR Gate," Sep. 2015.
Texas Instruments, "TI Logic and Linear Products," 2014.
Rhyne "Fundamentals of Digital Systems Design" N.J. pp. 70-71 (Year: 1973).
Texas Instruments "Digital Logic—Pocket Data Book" (Year 2007).

* cited by examiner

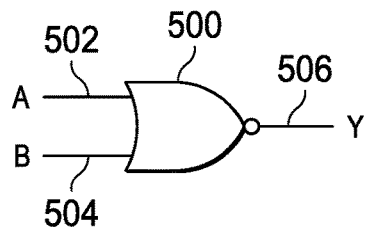
FIG. 5A
(PRIOR ART)
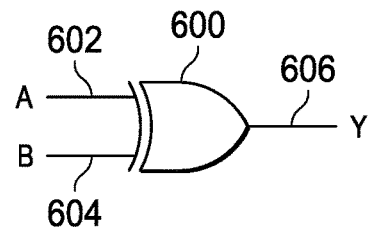
FIG. 6A
(PRIOR ART)
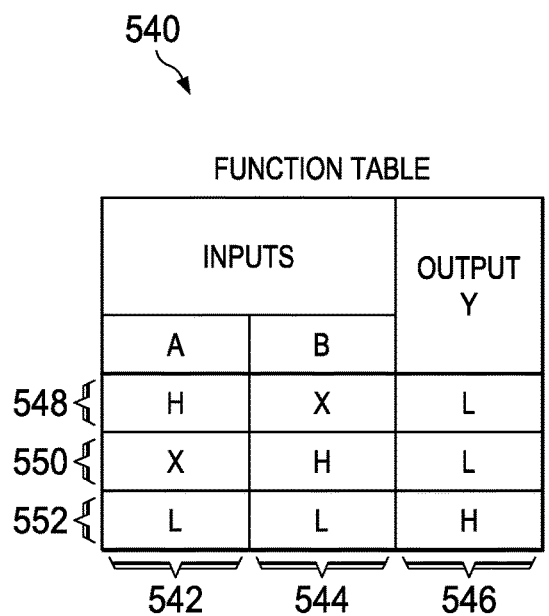
FIG. 5B
(PRIOR ART)
TABLE 1. FUNCTION TABLE
| INPUTS | | OUTPUT Y |
|---|---|---|
| A | B | |
| L | L | L |
| L | H | H |
| H | L | H |
| H | H | L |
FIG. 6B
(PRIOR ART)
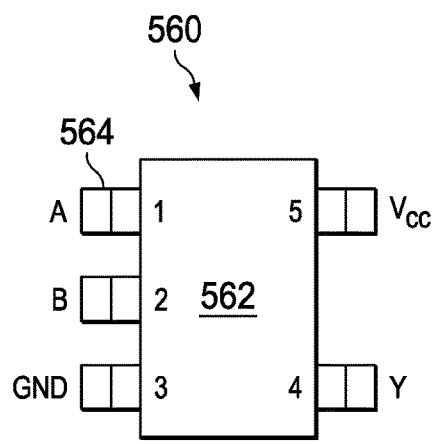
FIG. 5C
(PRIOR ART)
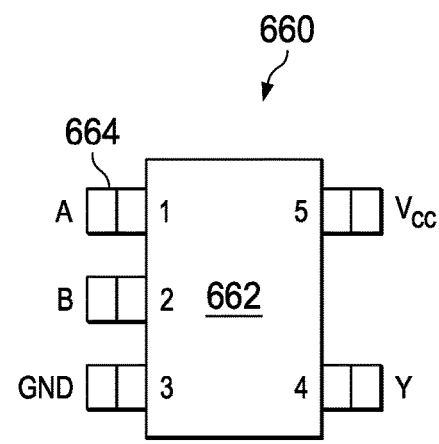
FIG. 6C
(PRIOR ART)

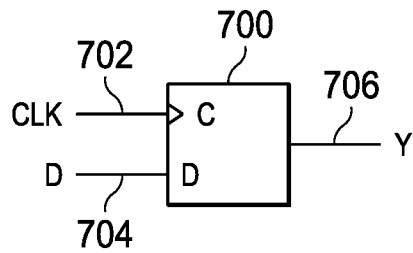
FIG. 7A
(PRIOR ART)
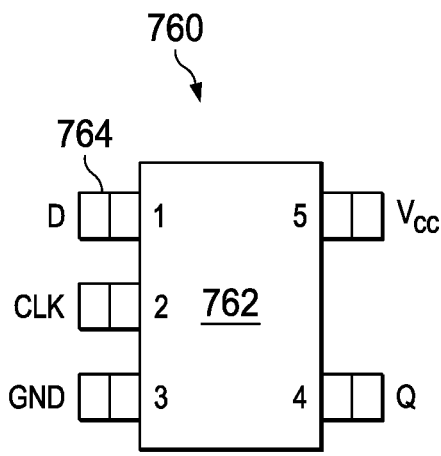
FIG. 7B
(PRIOR ART)
FIG. 7C
(PRIOR ART)

FUNCTION TABLE (EACH FLIP-FLOP)

| | $\overline{OE}$ | CLK | D | Output Q |
|---|---|---|---|---|
| 850 | L | ↑ | H | H |
| 852 | L | ↑ | L | L |
| 854 | L | H OR L | X | $Q_0$ |
| 856 | H | X | X | Z |
| | 842 | 844 | 846 | 848 |

IC WITH FIRST AND SECOND FUNCTIONAL CIRCUITS COUPLING ONLY FIRST CIRCUITS TO OUTPUT BOND PADS

This application is a divisional of prior application Ser. No. 15/635,998, filed Jun. 28, 2017, now U.S. Pat. No. 10,693,468, issued Jun. 23, 2020.

BACKGROUND OF THE DISCLOSURE

Standard, digital logic, integrated circuit or IC logic families were among the first IC parts designed and developed in the 1960s and now provide hundreds of different parts and specifications. Digital logic circuits provide basic Boolean logical functions such as an inverter, AND, NAND, OR, NOR, and Exclusive OR or XOR. Digital logic circuits also provide complex functions, such as flip flops, that are timed combinations of logic functions, and further provide other functions, such as multiplexers, used in digital logic circuitry.

Over time families of standard logic ICs were designed and developed with increasingly complex manufacturing processes, multiple logical functions, multiple different voltage, current, and timing specifications, and multiple different encapsulated packages.

Many of these logic ICs were originally designed and developed by large design teams, one part by one part, over a span of decades in the then current process technology. This design method made business sense in the early stages of the semiconductor era. However, since these logic families have become commoditized, generating new logic families with this old approach is not financially feasible.

Further, the multiple characteristics or specifications of the hundreds of logic ICs slow the delivery of logic ICs to customers or require a large inventory of logic ICs. Without an inventory of multiple logic ICs, a new customer order for specific logic ICs must be placed in the manufacturing cue with earlier orders and then wait for manufacture of a new batch of logic ICs, which slows delivery to a customer. Alternatively, completely finished and tested ICs can be available to immediately fill a customer order, but require substantial inventory of multiple ICs with multiple different specification waiting to fill unknown orders that may never occur, which is costly.

The inventory versus customer delivery time problem is accentuated by the large number of families of logic ICs and the large number of logic functions available in each family. The number of families can be as large as 40. These families provide multiple specification combinations, such as 0.8, 1.8, 2.5, 3.3, and 5 supply voltages in bipolar, CMOS, and BiCMOS technologies with overvoltage tolerant inputs and live insertion capabilities. Each family can provide multiple functions, such as buffers/line drivers, flip flops, combination logic, counters, shift registers, encoders/multiplexers, decoders/demultiplexers, gates, transceivers, level translators, phase lock loops, and bus switches.

The description in this specification has been prepared for a person skilled in this art and omits many details not necessary for understanding the disclosure. The drawings in the figures are abstract, high level representations of the circuit elements and logic functions depicted, such as gates, flip flops, multiplexers, non-volatile memory, and voltage regulators. The drawings intentionally omit details of implementation, such as individual transistors and their fabrication in a semiconductor die, to simplify the description and facilitate understanding of the disclosure. A person skilled in this art would understand the description of these abstract representations and understand the omission of more detailed structures or elements in the following description of the disclosure.

The descriptions of leads connecting bond pads to other elements omit descriptions of understood input and output circuits that couple the leads to the bond pads. Thus, the word "connect" may not in all cases mean a direct connection with no intervening circuits. Use of the word "couple" does infer that described, or other understood not described, structure may exist between the "coupled" elements. For example, a multiplexer circuit may selectively couple and uncouple an output of a logic function to a bond pad.

For example, FIGS. 1A, 1B, and 1C, respectively, depict a symbol for an inverter 100, a function table 140 for the inverter, and a plan view representation of an encapsulated, inverter integrated circuit 160.

Inverter 100 has an A input lead 102 and a Y output lead 104. Inverter 100 performs a logical function of providing a Y output that is the logical inverse of the input A. Thus a logic high or logic "H" applied to A input lead 102 results in a logic low or logic "L" output at Y output lead 104. A logic low or logic "L" applied to A input lead 102 results in a logic high or logic "H" at Y output lead 104. A logic level high, a logic high, or a logic "H" can also be described as a logic "1", and a logic level low, a logic low, or a logic "L" can also be described as a logic "0".

Function table 140 indicates the logical functions of inverter 100 with a column 142 for the possible logic states of the A input 102 and a column 144 for the resulting logic states of the Y output 104. Row 146 indicates that for a logic "H" on the A input, the Y output will be a logic "L". Row 148 indicates that for a logic "L" on the A input, the Y output will be a logic "H".

Encapsulated inverter integrated circuit or IC package 160 has a body 162 and 5 pins or terminals 164 numbered 1 through 5. Pin 1 is identified as "NC" or no connection. Pin 2 is identified as the A input 102. Pin 3 is identified as GND or the voltage ground electrical connection to the inverter. Pin 4 is identified as the Y output 104. Pin 5 is identified as Vcc or the voltage supply electrical connection to the inverter. In the figures depicting the logical functions, the voltage supply and ground connections are omitted as understood by a person of ordinary skill in this art to be necessary for the operation of the logical functions.

FIGS. 2A, 2B, and 2C, respectively, depict a symbol for a two input AND gate 200, a function table 240 for the AND gate, and a plan view representation of an encapsulated, AND gate integrated circuit 260.

AND gate 200 has an A input 202, a B input 204 and a Y output 206. AND gate 200 performs a logical function of providing a Y output that is the logical "AND" of the logic levels applied to the A input and the B input. Thus a logic "H" applied to A input 102 and a logic "H" applied to B input 104 results in a logic "H" at Y output 106. A logic "L" applied to either A input 202 or B input 204 results in a logic "L" at Y output 206.

Function table 240 indicates the logical functions of AND gate 200 with a column 242 for the possible logic states of the A input 202, a column 244 for the possible logic states of the B input 204, and a column 246 for the resulting logic states of the Y output 206. Row 248 indicates that for a logic "H" on the A input and a logic "H" on the B input, the Y output will be a logic "H". Row 250 indicates that for a logic "L" on the A input and a do not care state or logic "X" on the B input, the Y output will be a logic "L". Row 252 indicates that for a do not care logic state or logic "X" on the A input and a logic "L" on the B input, the Y output will be a logic "L". The do not care logic state or logic "X" means that applying a logic "H" or a logic "L" to an input will have no effect on the result at the output.

Encapsulated AND integrated circuit or IC package 260 has a body 262 and 5 pins or terminals 264 numbered 1 through 5. Pin 1 is identified as the A input 202. Pin 2 is identified as the B input 204. Pin 3 is identified as GND or the voltage ground electrical connection to the AND gate 200. Pin 4 is identified as the Y output 206. Pin 5 is identified as Vcc or the voltage supply electrical connection to the AND gate 200.

FIGS. 3A, 3B, and 3C, respectively, depict a symbol for a NAND gate 300, a function table 340 for the NAND gate, and a plan view representation of an encapsulated, NAND gate integrated circuit 360.

NAND gate 300 has an A input 302, a B input 304 and a Y output 306. NAND gate 300 performs a logical function of providing a Y output that is the logical "NAND" or "Not AND" of the logic levels applied to the A input and the B input. Thus a logic "H" applied to A input 302 and a logic "H" applied to B input 304 results in a logic "L" output at Y output 306. A logic "L" applied to either A input 302 or B input 304 results in a logic "H" at Y output 306.

Function table 340 indicates the logical functions of NAND gate 300 with a column 342 for the possible logic states of the A input 302, a column 344 for the possible logic states of the B input 304, and a column 346 for the resulting logic states of the Y output 304. Row 348 indicates that for a logic "H" on the A input and a logic "H" on the B input, the Y output will be a logic "L". Row 350 indicates that for a logic "L" on the A input and a logic "X" on the B input, the Y output will be a logic "H". Row 352 indicates that for a logic "X" on the A input and a logic "L" on the B input, the Y output will be a logic "H".

Encapsulated NAND integrated circuit or IC package 360 has a body 362 and 5 pins or terminals 364 numbered 1 through 5. Pin 1 is identified as the A input 302. Pin 2 is identified as the B input 304. Pin 3 is identified as GND or the voltage ground electrical connection to the NAND gate 300. Pin 4 is identified as the Y output 306. Pin 5 is identified as Vcc or the voltage supply electrical connection to the NAND gate 300.

FIGS. 4A, 4B, and 4C, respectively, depict a symbol for an OR gate 400, a function table 440 for the OR gate, and a plan view representation of an encapsulated, OR gate integrated circuit 460.

OR gate 400 has an A input 402, a B input 404 and a Y output 406. OR gate 400 performs a logical function of providing a Y output that is the logical "OR" of the logic levels applied to the A input and the B input. Thus a logic "H" applied to A input 402 or to B input 404 results in a logic "H" at Y output 406. A logic "L" applied to A input 402 and a logic "L" applied to B input 404 results in a logic "L" at Y output 406.

Function table 440 indicates the logical functions of OR gate 400 with a column 442 for the possible logic states of the A input 402, a column 444 for the possible logic states of the B input 404, and a column 446 for the resulting logic states of the Y output 406. Row 448 indicates that for a logic "H" on the A input and logic "X" on the B input, the Y output will be a logic "H". Row 450 indicates that for a logic "X" on the A input and a logic "H" on the B input, the Y output will be a logic "H". Row 452 indicates that for a logic "L" on the A input and a logic "L" on the B input, the Y output will be a logic "L".

Encapsulated OR integrated circuit or IC package 460 has a body 462 and 5 pins or terminals 464 numbered 1 through 5. Pin 1 is identified as the A input 402. Pin 2 is identified as the B input 404. Pin 3 is identified as GND or the voltage ground electrical connection to the OR gate 400. Pin 4 is identified as the Y output 406. Pin 5 is identified as Vcc or the voltage supply electrical connection to the OR gate 400.

FIGS. 5A, 5B, and 5C, respectively depict a symbol for a NOR gate 500, a function table 540 for the NOR gate, and a plan view representation of an encapsulated, NOR gate integrated circuit 560.

NOR gate 500 has an A input 502, a B input 504 and a Y output 506. NOR gate 500 performs a logical function of providing a Y output that is the logical "NOR" or "Not OR" of the logic levels applied to the A input and the B input. Thus a logic "H" applied to A input 502 or to B input 504 results in a logic "L" at Y output 506. A logic "L" applied to A input 502 and a logic "L" applied to B input 504 results in a logic "H" at Y output 506.

Function table 540 indicates the logical functions of NOR gate 500 with a column 542 for the possible logic states of the A input 502, a column 544 for the possible logic states of the B input 504, and a column 546 for the resulting logic states of the Y output 506. Row 548 indicates that for a logic "H" on the A input and logic "X" on the B input, the Y output will be a logic "L". Row 550 indicates that for a logic "X" on the A input and a logic "H" on the B input, the Y output will be a logic "L". Row 552 indicates that for a logic "L" on the A input and a logic "L" on the B input, the Y output will be a logic "H".

Encapsulated NOR integrated circuit or IC package 560 has a body 562 and 5 pins or terminals 564 numbered 1 through 5. Pin 1 is identified as the A input 502. Pin 2 is identified as the B input 504. Pin 3 is identified as GND or the voltage ground electrical connection to the NOR gate 500. Pin 4 is identified as the Y output 506. Pin 5 is identified as Vcc or the voltage supply electrical connection to the NOR gate 500.

FIGS. 6A, 6B, and 6C, respectively, depict a symbol for an EXCLUSIVE OR or XOR gate 600, a function table 640 for the EXCLUSIVE OR or XOR gate, and a plan view representation of an encapsulated, EXCLUSIVE OR or XOR gate integrated circuit 660.

XOR gate 600 has an A input 602, a B input 604 and a Y output 606. XOR gate 600 performs a logical function of providing a Y output that is the logical "EXCLUSIVE OR" of the logic levels applied to the A input and the B input. Thus a logic "L" applied to A input 602 and a logic "L" applied to B input 604 results in a logic "L" at Y output 606. A logic "H" applied to A input 602 and a logic "H" applied to B input 604 results in a logic "L" at Y output 606. A logic "H" applied to one of A input 602 or B input 604 and a logic "L" applied to the other of A input 602 or B input 604 results in a logic "H" at y output 606.

Function table 640 indicates the logical functions of XOR gate 600 with a column 642 for the possible logic states of the A input 602, a column 644 for the possible logic states of the B input 604, and a column 646 for the resulting logic states of the Y output 606. Row 648 indicates that for a logic "L" on the A input and logic "L" on the B input, the Y output will be a logic "L". Row 450 indicates that for a logic "L" on the A input and a logic "H" on the B input, the Y output will be a logic "H". Row 452 indicates that for a logic "H" on the A input and a logic "L" on the B input, the Y output will be a logic "H". Row 654 indicates that for a logic "H" on the A input and logic "H" on the B input, the Y output will be a logic "L".

Encapsulated XOR integrated circuit or IC package 660 has a body 662 and 5 pins or terminals 664 numbered 1 through 5. Pin 1 is identified as the A input 602. Pin 2 is identified as the B input 604. Pin 3 is identified as GND or the voltage ground electrical connection to the XOR gate 600. Pin 4 is identified as the Y output 606. Pin 5 is identified as Vcc or the voltage supply electrical connection to the XOR gate 600.

FIGS. 7A, 7B, and 7C, respectively, depict a symbol for a D-type flip flop 700, a function table 740 for the D-type flip flop, and a plan view representation of an encapsulated, D-type flip flop integrated circuit 760.

D-type flip flop 700 has a clock or CLK input 702, a data or D input 704 and a Y output 706. D-type flip flop 700 performs a function of providing a Y output that is the same logic level as the logic level applied to input D on a rising edge of a clock signal at CLK input 702. Thus a logic "H" applied to D input 702 at a rising edge of a clock signal applied to CLK input 702 results in a logic "H" at Y output 706. A logic "L" applied to D input 702 at a rising edge of a clock signal applied to CLK input 702 results in a logic "L" at Y output 706.

Function table 740 indicates the functions of D-type flip flop 700 with a column 742 for rising edges (indicated by up arrows ↑) of a clock signal applied to the CLK input 702 and one logic state of the clock signal at the CLK input 702, a column 744 for the possible logic states of the D input 704, and a column 746 for the resulting logic states of the Y output 706. Row 748 indicates that for a rising edge on the CLK input and logic "H" on the D input, the Y output will be a logic "H". Row 750 indicates that for a rising edge on the CLK input and a logic "L" on the D input, the Y output will be a logic "L". Row 752 indicates that for a logic "L" on the CLK input and a logic "X" on the D input, the Y output will be a logic "Q0" or the Y output at the previous rising edge of the clock signal at the CLK input.

Encapsulated D-type flip flop integrated circuit or IC package 760 has a body 762 and 5 pins or terminals 764 numbered 1 through 5. Pin 1 is identified as the D input 704. Pin 2 is identified as the CLK input 702. Pin 3 is identified as GND or the voltage ground electrical connection to the D-type flip flop 700. Pin 4 is identified as the Y or Q output 706. Pin 5 is identified as Vcc or the voltage supply electrical connection to the D-type flip flop 700.

FIGS. 8A, 8B, and 8C, respectively, depict a symbol for an octal D-type flip flop arrangement 800, a function table 840 for each D-type flip flop of the octal arrangement, and a plan view representation of an encapsulated, octal D-type flip flop integrated circuit 860.

Octal D-type flip flop arrangement 800 has eight D-type flip flops 802-1 through 802-8, eight data inputs, 1D input lead 804-1 through 8D input lead 804-8, one clock signal CLK input lead 806, an inverted output enable OE_input lead 808, and eight outputs, 1Q output lead 810-1 through 8Q output lead 810-8. Not all of the D-type flip flops are depicted to simplify the drawing. The lines in FIGS. 8A, 8B, and 8C, and the other figures indicate leads, wires, or some other electrical connection to, from, or between parts.

D-type flip flop 802-1 has a data input, 1D, to data input lead 804-1 and a clock input, C1, to CLK input lead 806 through buffer 812. D-type flip flop 802-8 has a data input, 8D, to data input lead 804-8 and a clock input, C8, to CLK input lead 806 through buffer 812. Thus each D-type flip flop has a separate data input, 1D through 8D, and has a common connection C1-C8 to the CLK input lead 806 through buffer 812.

D-type flip flop 802-1 has a data output, Y1, connected to output lead 1Q 810-1 through tristate output buffer 814-1. D-type flip flop 802-8 has a data output, Y8, connected to output lead 8Q 810-1 through tristate output buffer 814-8. Thus each D-type flip flop has a separate data output, Y1 through Y8, respectively connected to output leads 1Q 810-1 to 2Q 810-8 through tristate output buffers 814-1 through 814-8. Tristate output buffers 814-1 through 814-8 each have a tristate control input connected by leads to the inverted output enable OE_ input lead 808 through inverting buffer 814. Tristate buffers 814-1 through 814-8 in a normal condition pass the logic state at their inputs to their outputs. In a tristate condition, or Z state, these buffers block the logic state at their inputs and present an electrical open at their outputs. A logic "L" signal on the inverted output enable _OE input lead 808 provides the normal condition, and a logic "H" signal provides the tristate condition.

Each D-type flip flop 802-1 through 802-8 performs the same function as the D-type flip flop described in FIGS. 7A, 7B, and 7C. In a normal condition, each D-type flip flop performs the function of providing a Y and Q output that is the same logic level as the logic level applied to input D on a rising edge of a clock signal C1 at CLK input 806. Thus a logic "H" applied to the 1D input lead 804-1 at a rising edge of a clock signal C1 applied to CLK input lead 806 results in a logic "H" at the 1Y output and 1Q output lead 814-1. A logic "L" applied to the 1D input lead 804-1 at a rising edge of a clock signal C1 applied to CLK input lead 806 results in a logic "L" at the 1Y output and 1Q output lead 814-1.

Function table 840 indicates the functions of D-type flip flop arrangement 800 with a column 842 for the inverted output enable _OE signals applied to _OE input lead 808, a column 844 for the rising edges (indicated by up arrows ↑) and logic states of a clock signal applied to the CLK input lead 806, a column 846 for the possible logic states of the D inputs on input leads 804-1 through 804-8, and a column 848 for the resulting logic states of the Q outputs on output leads 810-1 through 810-8. Row 850 indicates that for a logic "L" on _OE, a rising edge on the CLK input and logic "H" on the D input, the Q output will be a logic "H". Row 852 indicates that for a logic "L" on _OE, a rising edge on the CLK input and a logic "L" on the D input, the Q output will be a logic "L". Row 854 indicates that for a logic "L" on _OE, a logic "H" or "L" on the CLK input and a logic "X" on the D input, the Q output will be a logic "Q0" or the Q output at the previous rising edge of the clock signal at the CLK input. Row 856 indicates that for a logic "H" on _OE, a logic "X" on the CLK input and a logic "X" on the D input, the Q output will be a logic "Z" or a tristate condition.

Encapsulated octal D-type flip flop integrated circuit or IC package 860 has a body 862 and 20 pins or terminals 864 numbered 1 through 20. The numbered pins and functional input or output leads are identified as follows:

| Pin Number | Input/Output lead |
|---|---|
| 1 | _OE |
| 2 | 1Q |
| 3 | 1D |
| 4 | 2D |
| 5 | 2Q |
| 6 | 3Q |
| 7 | 3D |
| 8 | 4D |
| 9 | 4Q |
| 10 | GND |
| 11 | CLK |
| 12 | 5Q |
| 13 | 5D |
| 14 | 6D |

| Pin Number | Input/Output lead |
| --- | --- |
| 15 | 6Q |
| 16 | 7Q |
| 17 | 7D |
| 18 | 8D |
| 19 | 8Q |
| 20 | Vcc |

FIG. 9 depicts an integrated circuit 900 with a substrate of semiconductor material 902, core circuitry 904, and six bond pads 906-1 through 906-6. The core circuitry can be any desired circuitry including logic circuitry such as the inverter circuitry of FIG. 1A, the AND circuitry of FIG. 2A, the NAND circuitry of FIG. 3A, the OR circuitry of FIG. 4A, the NOR circuitry of FIG. 5A, the XOR circuitry of FIG. 6A, the D-type flip flop circuitry of FIG. 7A, or any other desired circuitry that has six or less inputs and outputs.

FIG. 10 depicts an integrated circuit 1000 with a substrate of semiconductor material 1002, core circuitry 1004, and eight bond pads 1006-1 through 1006-8. The core circuitry can be any desired circuitry including combinations of logic circuitry such as the inverter circuitry of FIG. 1A, the AND circuitry of FIG. 2A, the NAND circuitry of FIG. 3A, the OR circuitry of FIG. 4A, the NOR circuitry of FIG. 5A, the XOR circuitry of FIG. 6A, the D-type flip flop circuitry of FIG. 7A, or any other desired circuitry that has eight or less inputs and outputs.

FIG. 11 depicts an integrated circuit 1100 with a substrate of semiconductor material 1102, core circuitry 1104, and fourteen bond pads 1106-1 through 1106-14. The core circuitry can be any desired circuitry including combinations of logic circuitry such as the inverter circuitry of FIG. 1A, the AND circuitry of FIG. 2A, the NAND circuitry of FIG. 3A, the OR circuitry of FIG. 4A, the NOR circuitry of FIG. 5A, the XOR circuitry of FIG. 6A, the D-type flip flop circuitry of FIG. 7A, or any other desired circuitry that has fourteen or less inputs and outputs.

FIG. 12 depicts an integrated circuit 1200 with a substrate of semiconductor material 1202, core circuitry 1204, and twenty bond pads 1206-1 through 1206-20. The core circuitry can be any desired circuitry including combinations of logic circuitry such as the inverter circuitry of FIG. 1A, the AND circuitry of FIG. 2A, the NAND circuitry of FIG. 3A, the OR circuitry of FIG. 4A, the NOR circuitry of FIG. 5A, the XOR circuitry of FIG. 6A, the D-type flip flop circuitry of FIG. 7A, or any other desired circuitry that has twenty or less inputs and outputs.

FIGS. 13A, 13B, and 13C, respectively, depict a dual AND gate arrangement 1300, a function table 1340 for the dual AND gate arrangement, and a plan view representation of an encapsulated, dual AND gate integrated circuit 1360.

AND gate 1302 has a 1A input 1304, a 1B input 1306 and a 1Y output 1308. AND gate 1310 has a 2A input 1312, a 2B input 1314 and a 2Y output 1316. Each AND gate 1302 and 1310 provide the same functions as described for the AND gate 200 in FIG. 2A. Function table 1340 indicates the same logical functions of AND gates 1302 and 1310 as the AND gate 200 in FIG. 2A.

Encapsulated dual AND integrated circuit or IC package 1360 has a body 1362 and eight pins or terminals 1364 numbered 1 through 5. Pin 1 is identified as the 1A input 1304. Pin 2 is identified as the 1B input 1306. Pin 3 is identified as the 2Y output 1316. Pin 4 is indicated as the GND or the voltage ground electrical connection to the package 1360. Pin 5 is identified as the 2A input 1312. Pin 6 is identified as the 2B input 1314. Pin 6 is identified as the 1Y output 1308. Pin 8 is identified as Vcc or the voltage supply electrical connection to the package 1360.

Reducing the number of different parts that must be manufactured to supply all of these and other configurations would provide significant cost savings in inventory and reduce the time to supply customer orders.

BRIEF SUMMARY OF THE DISCLOSURE

A digital logic integrated circuit (IC) provides a family of digital logic functions. The family has the same specifications for voltage input high, voltage input low, voltage output high, and voltage output low, and the functions have the same number of bond pads. A substrate of semiconductor material has a core area and a peripheral area. A certain number of bond pads are formed on the semiconductor material in the peripheral area. The certain number of bond pads determines the total area, including the core area and peripheral area, of the substrate. Programmable digital logic transistor circuitry is formed in the core area of the semiconductor material for each of the digital logic functions in the family. Programmable input and output circuitry is formed in the peripheral area for the bond pads and is coupled between a bond pad and the programmable digital logic transistor circuitry. Programming circuitry programs the programmable digital logic transistor circuitry into a selected digital logic function. Programmable input and output means program the input and output circuitry into input and output circuits for the selected digital logic function.

The programmable digital logic transistor circuitry includes digital logic function circuitry that provides a certain digital logic function and that operates faster than a certain propagation delay specification. The programmable digital logic transistor circuitry includes additional transistor circuitry coupled to the digital logic function circuitry that provides the digital logic function with the certain propagation delay specification.

The programmable digital logic transistor circuitry includes core circuitry operating at a voltage lower than a supply voltage, and includes voltage level shifter circuitry coupled between the core circuitry and the input and output circuitry.

The programmable function means and the programmable input and output means include one of metal mask strap connections and fuses among transistors in the programmable digital logic transistor circuitry and the programmable input and output circuitry.

The programmable function means and the programmable input and output means include non-volatile memory supplying control signals to the programmable digital logic transistor circuitry.

The certain number of bond pads is one of 6 bond pads, 8 bond pads, 14 bond pads, 16 bond pads, and 20 bond pads. The disclosure is not limited to these numbers of bond pads and logic families with other numbers of bond pads can be used.

BRIEF DESCRIPTION OF THE VIEWS OF THE DRAWINGS

FIGS. 5A, 5B, and 5C, respectively are a symbol for a NOR gate, a function table for the NOR gate, and a plan view representation of an encapsulated integrated circuit NOR gate.

FIGS. 6A, 6B, and 6C, respectively are a symbol for an EXCLUSIVE OR gate, a function table for the EXCLUSIVE OR gate, and a plan view representation of an encapsulated integrated circuit EXCLUSIVE OR gate.

FIGS. 7A, 7B, and 7C, respectively are a symbol for a D-type flip flop, a function table for the D-type flip flop, and a plan view representation of an encapsulated integrated circuit D-type flip flop.

DETAILED DESCRIPTION OF THE DISCLOSURE

Figure 1A:
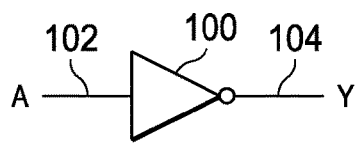
FIGS. 1A, 1B, and 1C, respectively are a symbol for an inverter, a function table for the inverter, and a plan view representation of an encapsulated integrated circuit inverter.
Figure 2A:
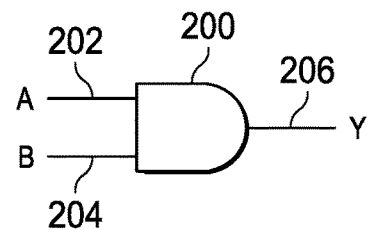
FIGS. 2A, 2B, and 2C, respectively are a symbol for an AND gate, a function table for the AND gate, and a plan view representation of an encapsulated integrated circuit AND gate.
Figure 1B:
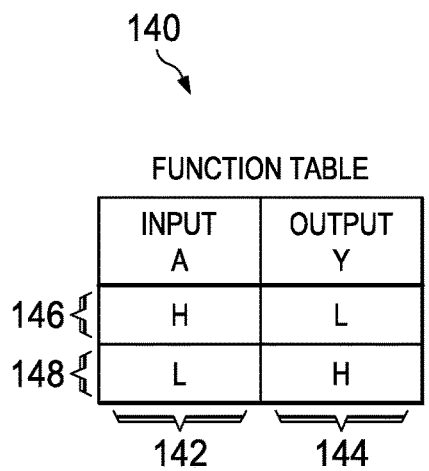
Figure 2B:
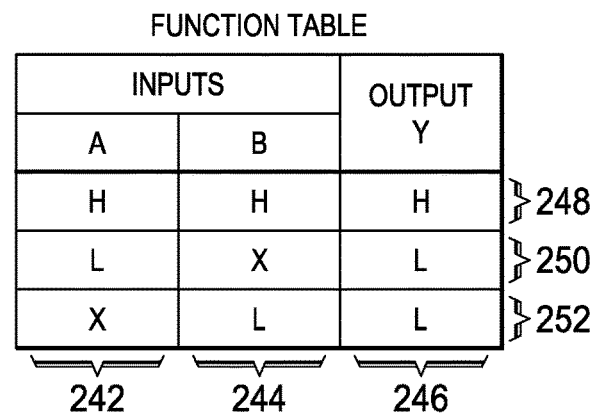
Figure 1C:
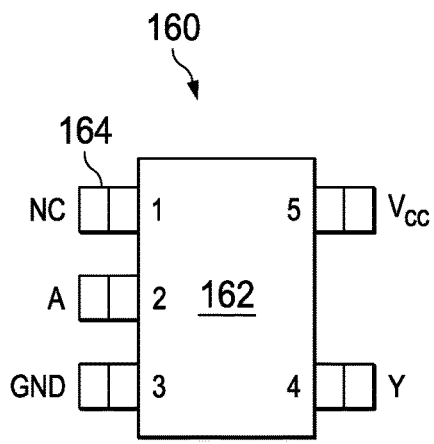
Figure 2C:
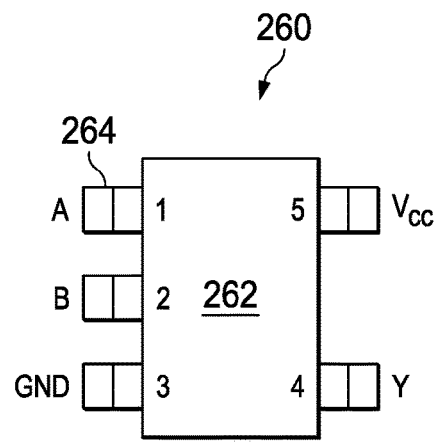
Figure 3A:
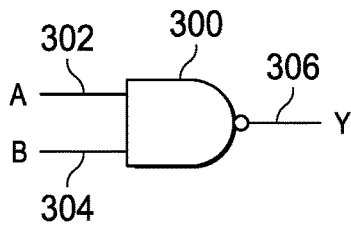
FIGS. 3A, 3B, and 3C, respectively are a symbol for a NAND gate, a function table for the NAND gate, and a plan view representation of an encapsulated integrated circuit NAND gate.
Figure 4A:
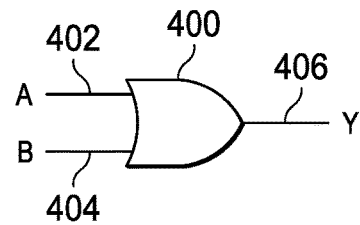
FIGS. 4A, 4B, and 4C, respectively are a symbol for an OR gate, a function table for the OR gate, and a plan view representation of an encapsulated integrated circuit OR gate.
Figure 3B:
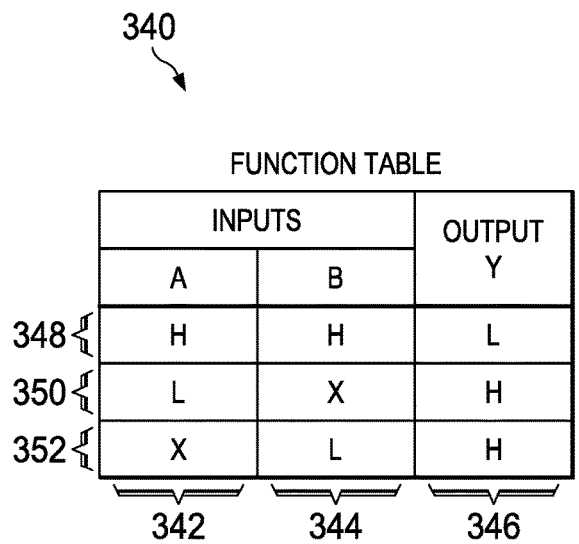
Figure 4B:
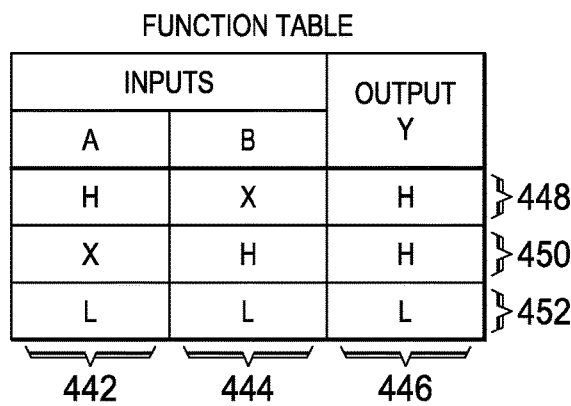
Figure 3C:
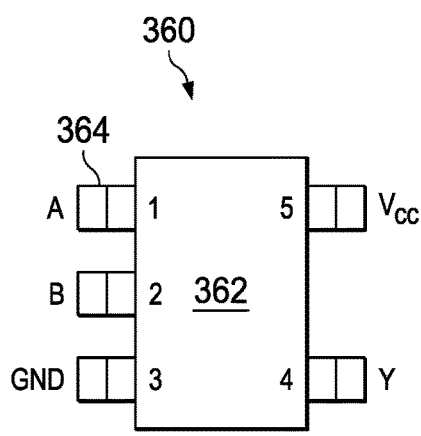
Figure 4C:
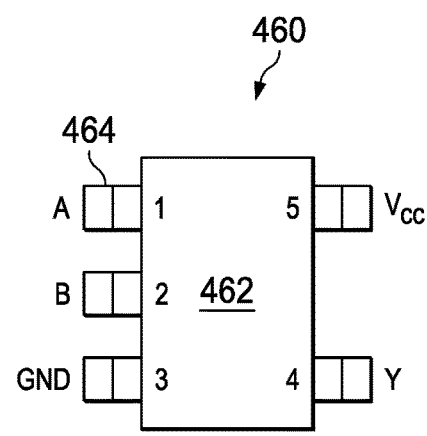
Figures 8A, 8B:
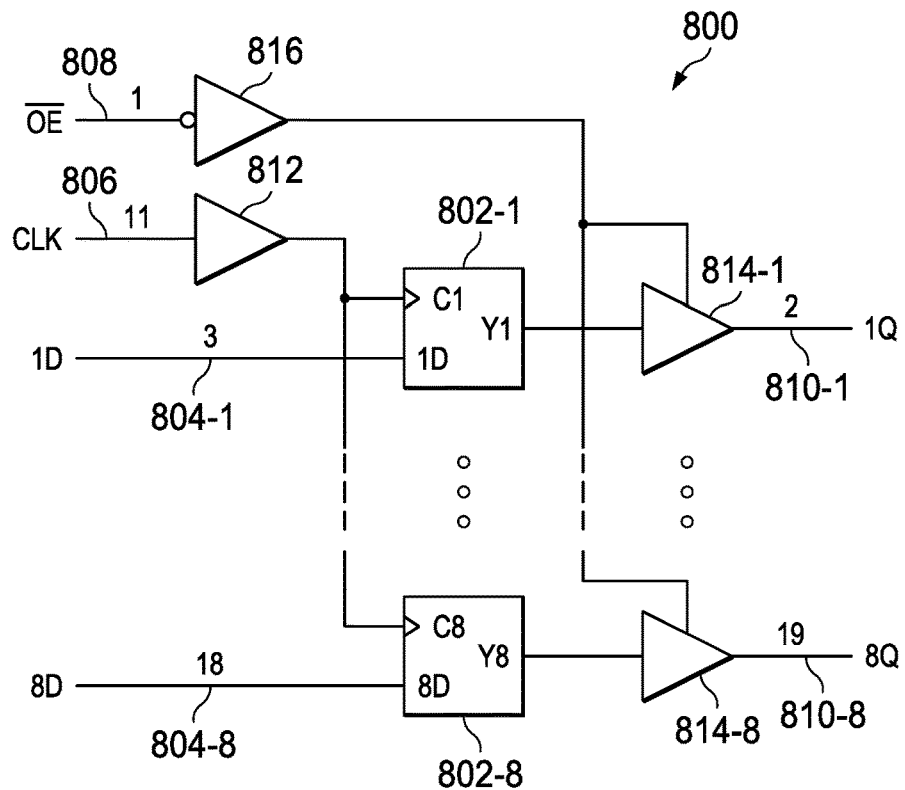
FIGS. 8A, 8B, and 8C, respectively are a symbol for an octal D-type flip flop arrangement, a function table for each D-type flip flop of the octal arrangement, and a plan view representation of an encapsulated integrated circuit octal D-type flip flop arrangement.
Figure 8C:
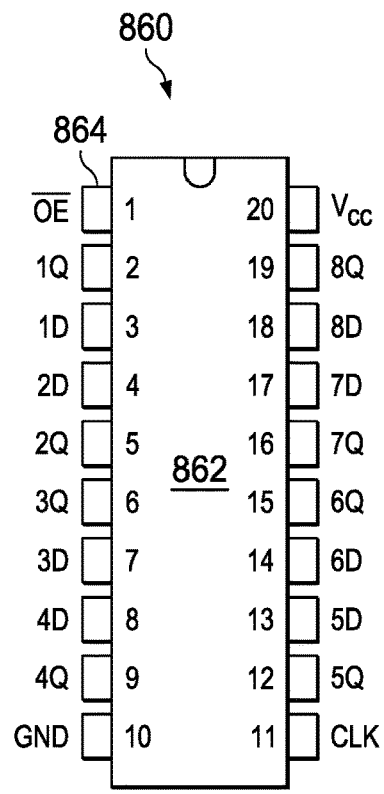
Figure 9:
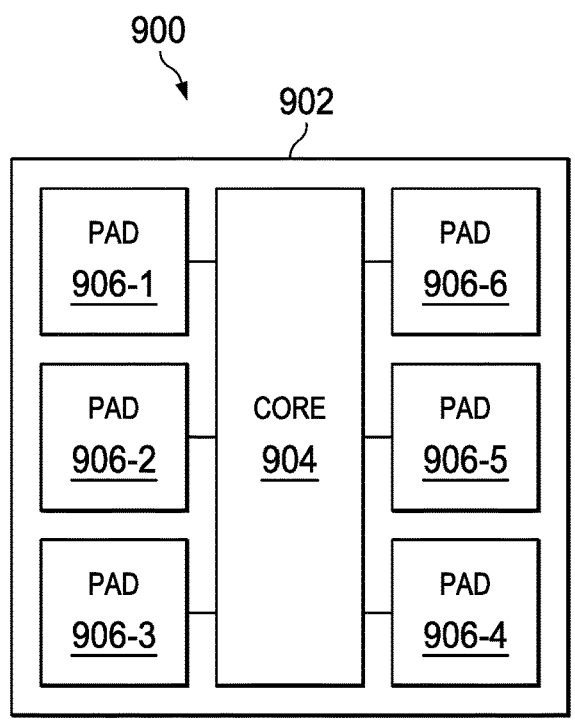
FIG. 9 is a plan view of an integrated circuit with 6 bond pads.
Figure 10:
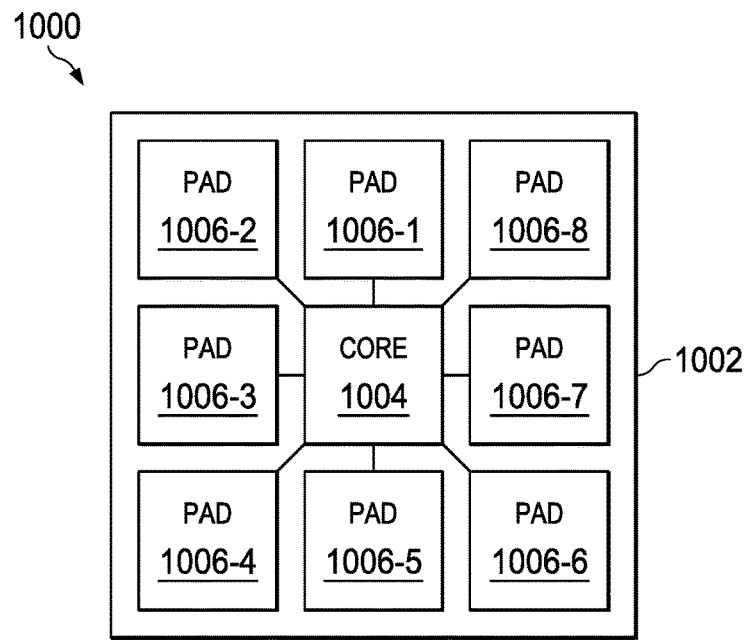
FIG. 10 is a plan view of an integrated circuit with 8 bond pads.
Figure 11:
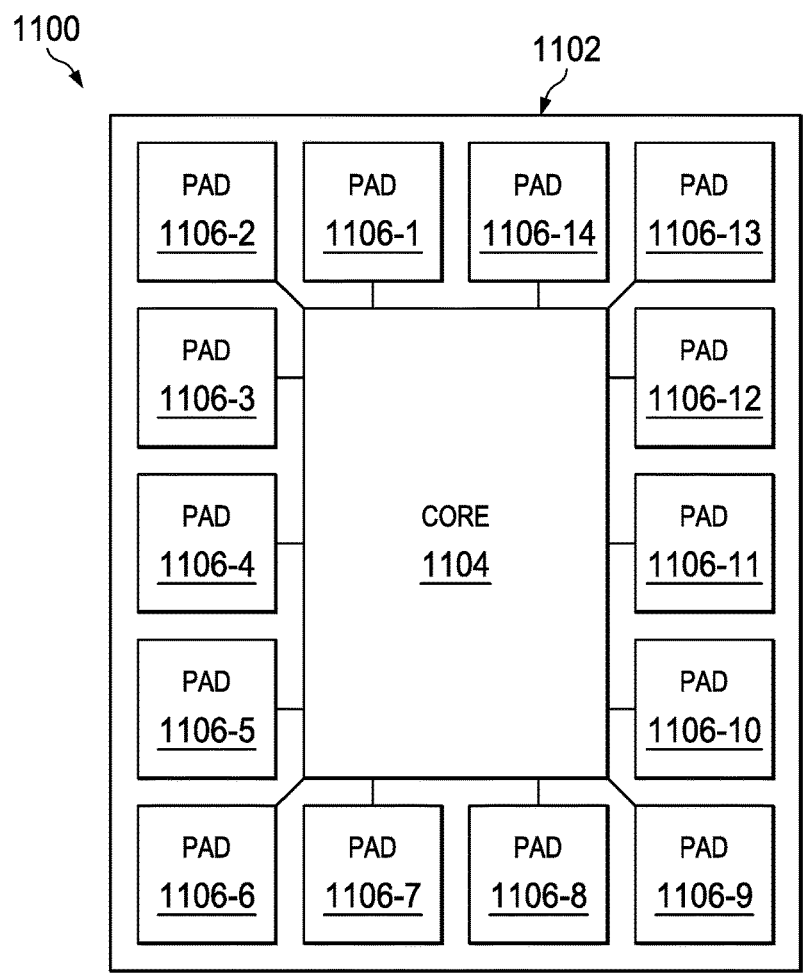
FIG. 11 is a plan view of an integrated circuit with 14 bond pads.
Figure 12:
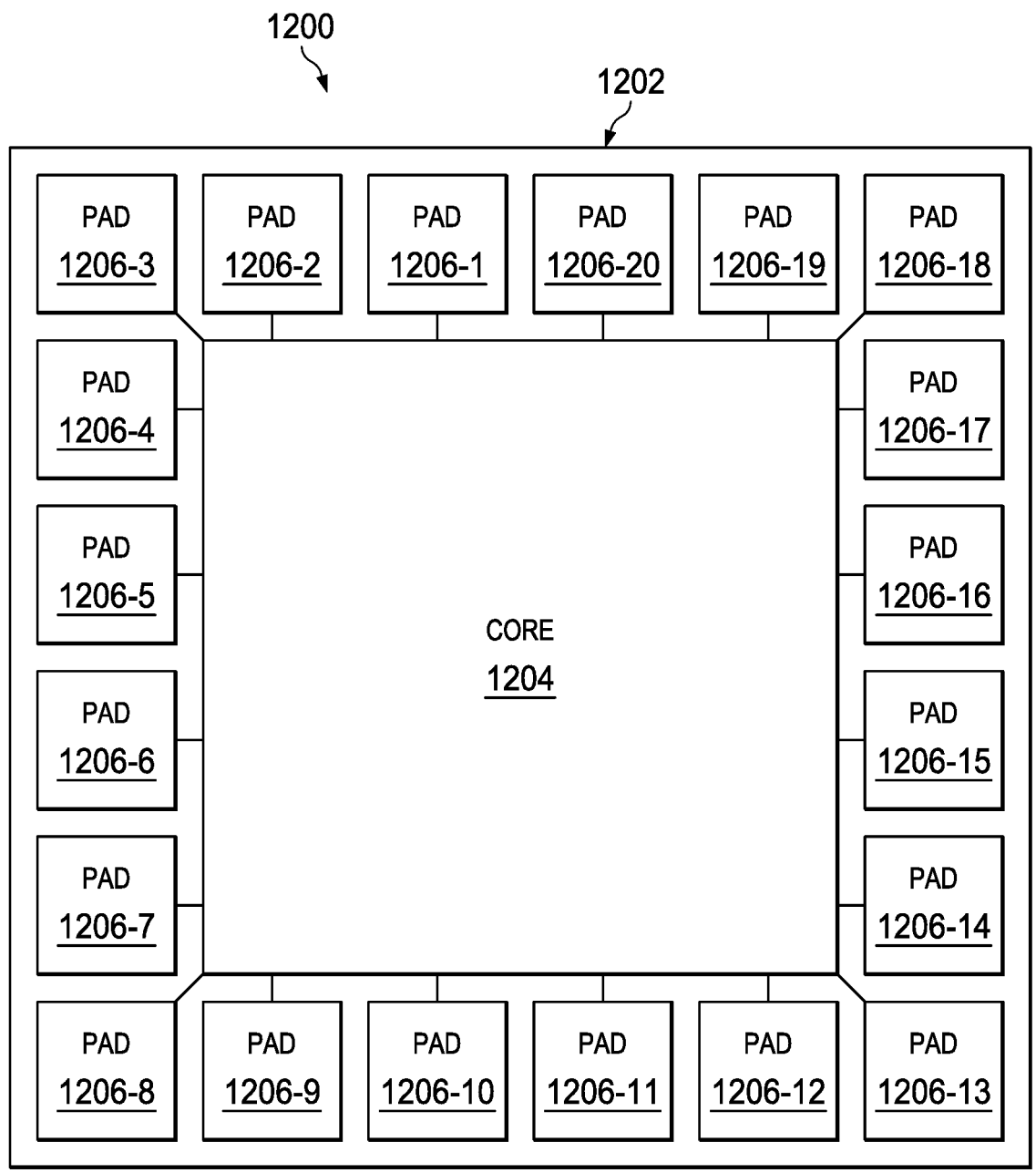
FIG. 12 is a plan view of an integrated circuit with 20 bond pads.
Figure 13A:
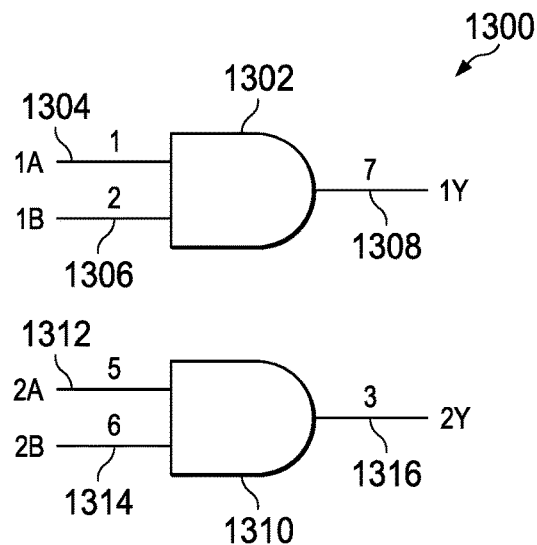
FIGS. 13A, 13B, and 13C, respectively are a symbol for a dual AND gate arrangement, a function table for the dual AND gate arrangement, and a plan view representation of an encapsulated integrated circuit dual AND gate arrangement.
Figure 13B:
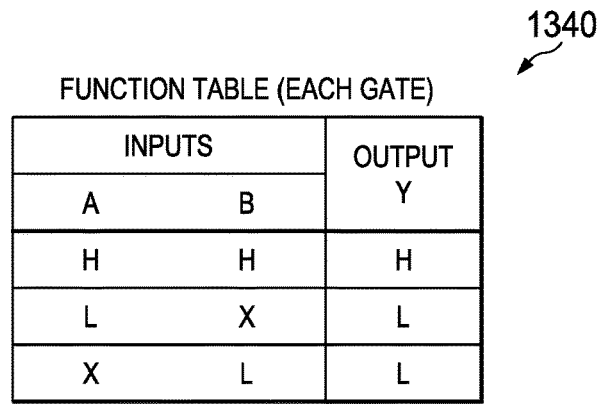
Figure 13C:
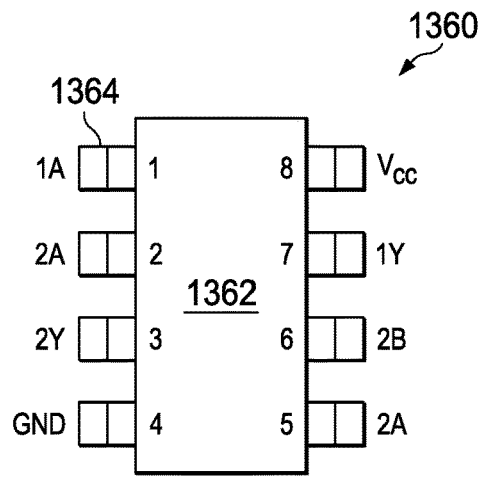

The problem of inventory and customer delivery time can be addressed with more efficiency using master designs for groups of digital logic functions in early semiconductor processing steps and differentiated late processing steps for the individual parts. The late processing steps can be the use of upper metal level layer straps, fuses, or non-volatile memory to select a desired logic function from the available group of logic functions.

The digital logic families can be divided in to bond pad or package pin groups. For example, in one low voltage CMOS family the over 300 unique parts can be divided into groups having 6 bond pads, 8 bond pads, 14 bond pads, 16 bond pads, and 20 bond pads or pins. A design can fix the layout of the bond pad locations for each pin group using minimum bond pad areas to pass packaging rules. With present semiconductor process technologies usage, the minimum semiconductor die area is limited by the peripheral area of a die required for the bond pads.

Using state of the art, sub-180 nm semiconductor process technology, digital density of 20 k+ transistor gates per mm² is achievable for transistors operating at 3 or 5 volts. This density provides for multiple logic functions to be designed into a very small area of semiconductor material. In some cases the functions on 40 or more old logic dies may be designed onto a new, single base die. These functions can be designed into a core area of a semiconductor die with the bond pads in the peripheral area of the die.

Designs can provide general purpose input, output, input/output (I/O) and electrostatic discharge (ESD) protection circuits connected to the bond pads for each family having the same input voltage high (VIH), input voltage low (VIL), output voltage high (VOH), output voltage low (VOL) requirements for all of the parts in the family. The designs can provide general purpose I/O circuits to be selected as an input or an output circuit via an I/O_SEL pin or feature. As such, any I/O circuit can be configured as an input or an output.

The propagation delay between any input/output combination can be equalized, simplifying the data sheet, design, characterization and testing of each part in a family. The propagation delays can be equalized by adding redundant logic gates on fast circuit paths to make the delays approximately the same for every path. The layout can then be carefully planned out to make each circuit path have the approximately the same interconnect delay by making each circuit path follow the same repeated layout structure. The high density of the logic circuits makes this approach feasible by trading off layout area efficiency for equalized repeating layout structures.

Using non-volatile memory for programming master parts has significant benefits since parts can be programed at final test, simplifying wafer production and reducing inventory. Using non-volatile memory, all functions within a pin group can be designed with a single mask design.

Entering into a non-volatile program mode can be enabled by triggering a test mode of the part. The availability of programmable input and output circuits in these logic devices makes a test mode design feasible, and different test mode schemes can be implemented. An example is a test mode scheme where a semiconductor device enters test mode by pulling one of the I/Os above Vcc. At this point, other two I/Os can be used as a serial data input and a serial clock input. These types of schemes can be implemented with few hundreds of transistor gates leaving enough area for implementing product operating logic functions.

Some design combinations may use both lower-voltage and higher density transistor gates for the I/O circuits and the core operating circuits. These lower voltage transistor gates could operate at such as 1.2 volts, 1.8 volts, or lower below a supply voltage VDD. In this case, an internal sub-µA low drop out (LDO) voltage regulator is designed in the IC and the operating logic and any non-volatile memory is run at a lower voltage VDDL level. Level shifting circuits could be used between IO circuits and the digital core logic circuits.

Figure 14:
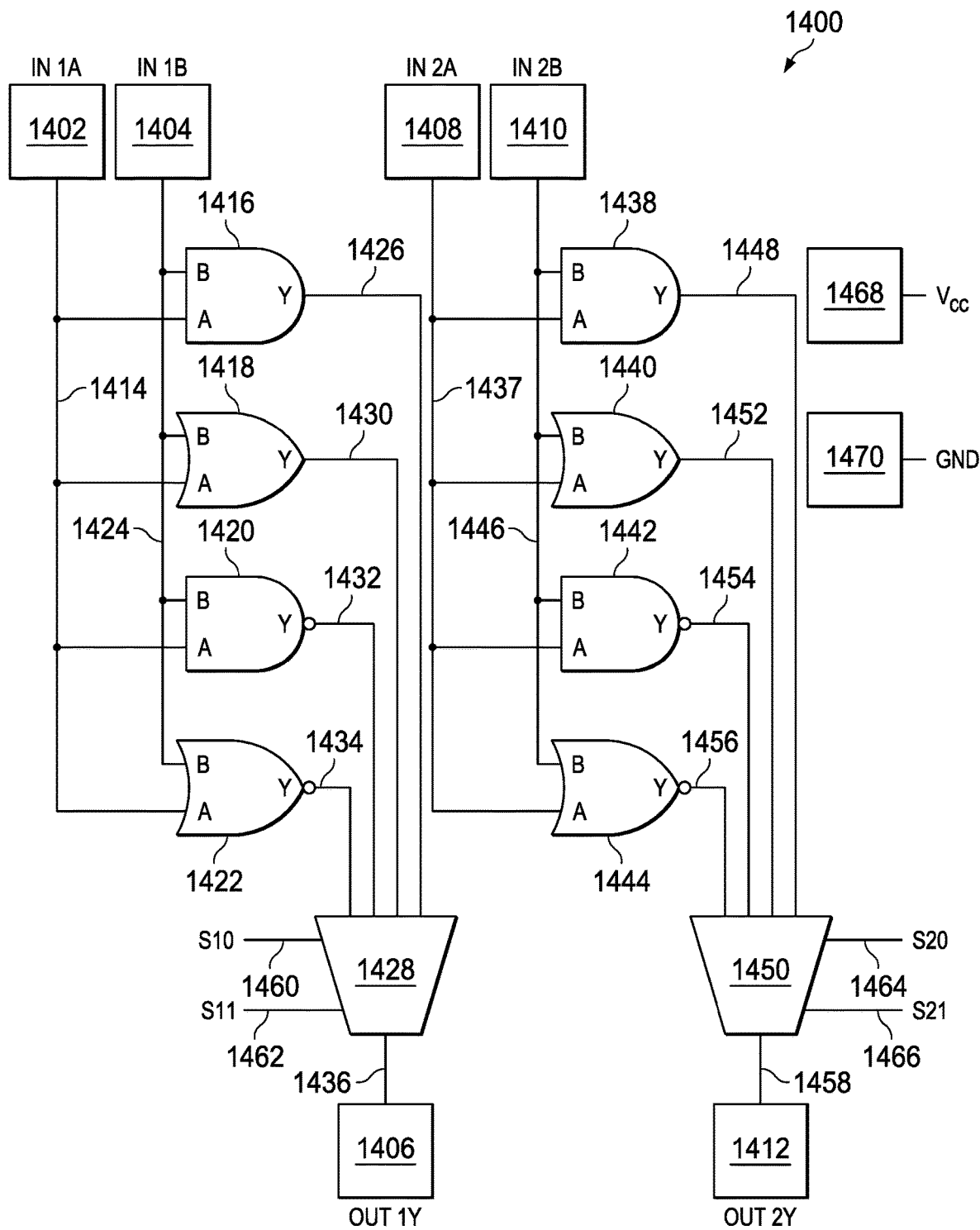
FIG. 14 is partial schematic diagram of an integrated circuit with selectable dual AND, OR, NAND, and NOR gates of the disclosure, using a multiplexer.

FIG. 14, in accordance with the disclosure, depicts a partial schematic diagram of an integrated circuit 1400 with selectable dual AND, OR, NAND, and NOR gates using multiplexers. IC 1400 includes 1A input bond pad 1402, 1B input bond pad 1404, 1Y output bond pad 1406, 2A input bond pad 1408, 2B input bond pad 1410, and 2Y output bond pad 1412. Lead 1414 connects the 1A input bond pad 1402 to the A inputs of AND gate 1416, OR gate 1418, NAND gate 1420, and NOR gate 1422. Lead 1424 connects the 1B input bond pad 1404 to the B inputs of AND gate 1416, OR gate 1418, NAND gate 1420, and NOR gate 1422.

Lead 1426 connects the Y output of AND gate 1416 to an input of multiplexer 1428. Lead 1430 connects the Y output of OR gate 1418 to an input of multiplexer 1428. Lead 1432 connects the Y output of NAND gate 1420 to an input of multiplexer 1428. Lead 1434 connects the Y output of NOR gate 1422 to an input of multiplexer 1428. Lead 1436 connects the output of multiplexer 1428 to 1Y output bond pad 1406.

IC 1400 also includes 2A input bond pad 1408, 2B input bond pad 1410, and 2Y output bond pad 1412. Lead 1437 connects the 2A input bond pad 1408 to the A inputs of AND gate 1438, OR gate 1440, NAND gate 1442, and NOR gate 1444. Lead 1446 connects the 2B input bond pad 1410 to the B inputs of AND gate 1438, OR gate 1440, NAND gate 1442, and NOR gate 1444.

Lead 1448 connects the Y output of AND gate 1438 to an input of multiplexer 1450. Lead 1452 connects the Y output of OR gate 1440 to an input of multiplexer 1450. Lead 1454 connects the Y output of NAND gate 1442 to an input of multiplexer 1450. Lead 1456 connects the Y output of NOR gate 1444 to an input of multiplexer 1450. Lead 1458 connects the output of multiplexer 1450 to 2Y output bond pad 1412.

Multiplexer 1428 has two control input leads, S10 control input lead 1460 and S11 control input lead 1462. Multiplexer 1450 has two control input leads, S20 control input lead 1464 and S21 control input lead 1466. Multiplexers 1428 and 1450, depending on the binary combination of the logic states on the S10, S11, S20, S21 control signal leads 1460-1466, each selectably connect one of the Y outputs of the gates to the output bond pads 1406 and 1412. The source of the control signals on the control input leads will be described in later figures.

IC 1400 also has a Vcc bond pad 1468 and a GND bond pad 1470.

In one design and in one package with the 1A, 1B, 1Y, 2A, 2B, 2Y, Vcc and GND bond pads connected to external pins in an eight pin package, IC 1400 selectably provides one of four logical functions of dual AND gates 1416 and 1438, or dual OR gates 1418 and 1440, or dual NAND gates 1420 and 1442, or dual NOR gates 1422 and 1444, depending upon the control signals occurring on control input leads 1460, 1462, 1464, and 1466.

In the same design and with only the 1A, 1B, 1Y, Vcc and GND bond pads connected to external pins in a five pin package, IC 1400 selectably provides one of four logical functions of a single dual input AND gate 1416, or a single dual input OR gate 1418, or a single dual input NAND gate 1420, or a single dual input NOR gate 1422, depending upon the control signals occurring on control input leads 1460 and 1462.

In the same design and with only the 2A, 2B, 2Y, Vcc, and GND bond pads connected to external pins in a five pin package, IC 1400 selectably provides one of four logical functions of a single dual input AND gate 1438, or a single dual input OR gate 1440, or a single dual input NAND gate 1442, or a single dual input NOR gate 1444, depending upon the control signals occurring on control input leads 1464 and 1466.

Depending upon the binary combination of logic states on the S10, S11, S20, and S21 control signal leads, 1460-1466, IC 1400 selectably provides the logical function of single, dual input AND gate 200, single, dual input NAND gate 300, single, dual input OR gate 400, single, dual input NOR gate 500, or dual, dual input AND gate 1300 in this one design. In one package, IC 1400 can provide any one of at least eight logical functions, as follows:

dual AND gates 1416, 1438;
 dual OR gates 1418, 1440;
 dual NAND gates 1420, 1442;
 dual NOR gates 1422, 1444;
 a single, dual input AND gate;
 a single, dual input OR gate;
 a single, dual input NAND gate;
 a single, dual input NOR gate;
 or any combination of single, dual input gates desired.

This arrangement of logical functions in one design reduces engineering design time by designing eight selectable parts at one time, instead of designing eight separate parts. This arrangement of logical functions in one design also reduces inventory and time to deliver a customer order. By making IC 1400 only to an intermediate manufacturing step, keeping only that intermediate product in inventory, and later finishing manufacturing by selecting the desired logical function according to a customer order, this design can reduce inventory requirements and time to delivery after the customer order.

Figure 15:
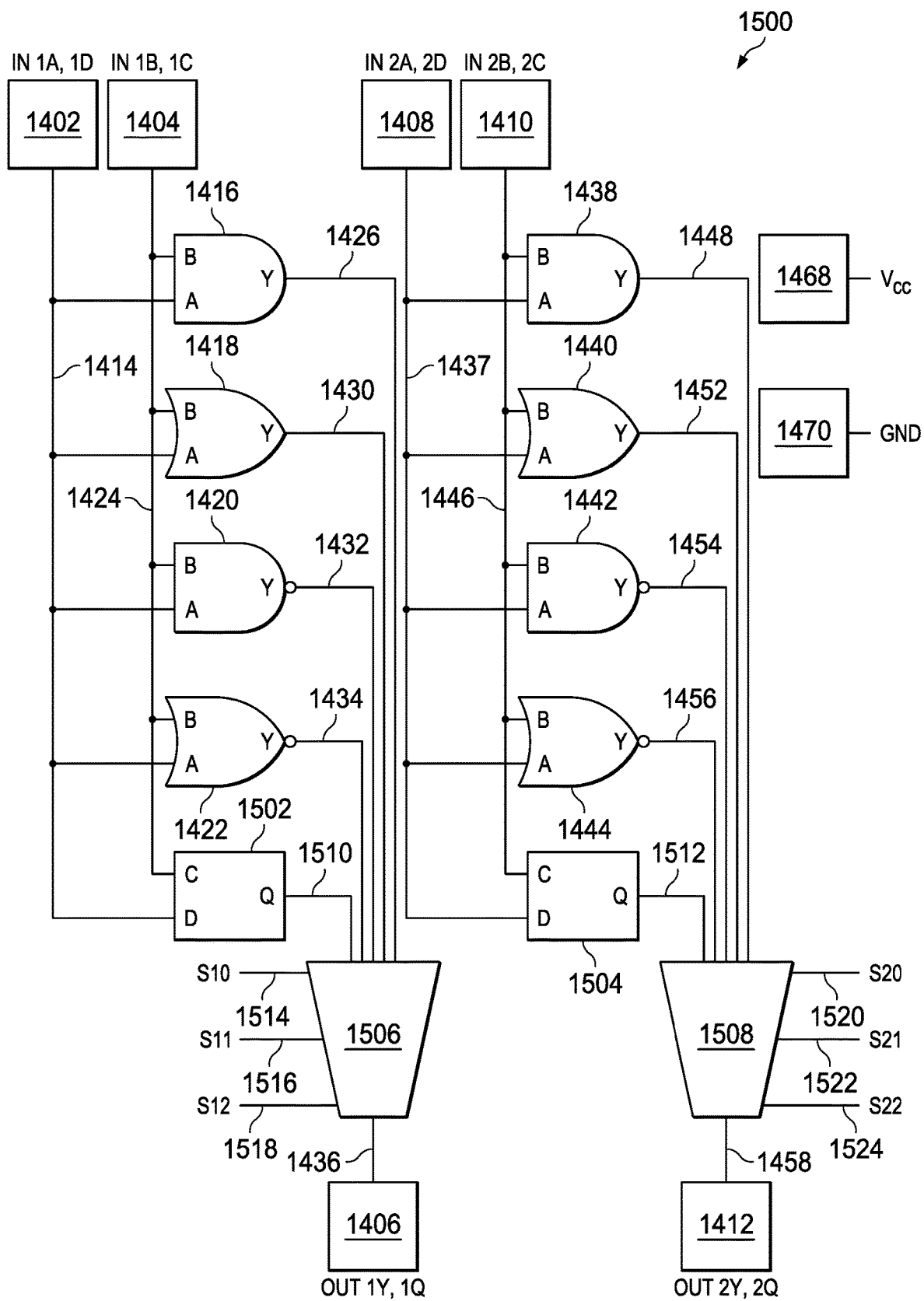
FIG. 15 is partial schematic diagram of an integrated circuit with selectable dual AND, OR, NAND, NOR gates, and D-type flip flops of the disclosure, using a multiplexer.

FIG. 15, in accordance with the disclosure, depicts a partial schematic diagram of an integrated circuit 1500 with selectable dual AND, OR, NAND, and NOR gates and D-type flip flops using multiplexers. IC 1500 is the same as IC 1400 with an addition of D-type flip flops 1502 and 1504 and the replacement of the multiplexers 1428 and 1450 with multiplexers 1506 and 1508.

Lead 1414 connects the 1A input bond pad 1402 to the D input of D-type flip flop 1502. Lead 1424 connects the 1B input bond pad 1404 to the C inputs of D-type flip flop 1504. Lead 1510 connects the Q output of D-type flip flop 1502 to an input of multiplexer 1506.

Lead 1437 connects the 2A input bond pad 1408 to the D input of D-type flip flop 1504. Lead 1446 connects the 2B input bond pad 1410 to the C input of D-type flip flop 1504.

Lead 1512 connects the Q output of D-type flip flop 1504 to an input of multiplexer 1508.

Multiplexer 1506 has three control input leads, S10 control input lead 1514, S11 control input lead 1516, and S12 control input lead 1518. Multiplexer 1508 has three control input leads, S20 control input lead 1520, S21 control input lead 1522, and S22 control input lead 1524. Multiplexers 1506 and 1508, depending on the control signals, each selectably connect one of the Y outputs of the gates or the Q outputs of the D-type flip flops to the output bond pads 1406 and 1412. The source of the control signals on the control input leads will be described in later figures.

IC 1500 also has a Vcc bond pad 1468 and a GND bond pad 1470.

In one design and in one package with the 1A, 1B, 1Y, 2A, 2B, 2Y, Vcc and GND bond pads connected to external pins in an eight pin package, IC 1400 selectably provides one of four logical functions of dual AND gates 1416 and 1438, or dual OR gates 1418 and 1440, or dual NAND gates 1420 and 1442, or dual NOR gates 1422 and 1444, or dual D-type flip flops 1506 and 1508, depending upon the binary combination of control signals occurring on the S10, S11, S12, S20, S21, S22 control input leads 1514, 1516, 1518, 1520, 1522, and 1524.

In the same design and with only the 1A, 1B, 1Y, Vcc and GND bond pads connected to external pins in a five pin package, IC 1400 selectably provides one of four logical functions of a single dual input AND gate 1416, or a single dual input OR gate 1418, or a single dual input NAND gate 1420, or a single dual input NOR gate 1422, or a single D-type flip flop 1506, depending upon the control signals occurring on control input leads 1514, 1516, and 1518.

In the same design and with only the 2A, 2B, 2Y, Vcc, and GND bond pads connected to external pins in a five pin package, IC 1400 selectably provides one of four logical functions of a single dual input AND gate 1438, or a single dual input OR gate 1440, or a single dual input NAND gate 1442, or a single dual input NOR gate 1444, or a single D-type flip flop 1508, depending upon the control signals occurring on control input leads 1520, 1522, and 1524.

IC 1500 selectably provides the logical function of single, dual input AND gate 200, or single, dual input NAND gate 300, or single, dual input OR gate 400, or single, dual input NOR gate 500, or dual, dual input AND gate 1300, or D-type flip flop 700 in this one design. In one package, IC 1500 can provide any one of at least ten functions, as follows:
dual AND gates 1416, 1438;
dual OR gates 1418, 1440;
dual NAND gates 1420, 1442;
dual NOR gates 1422, 1444;
dual D-type flip flops 1506, 1508;
a single, dual input AND gate;
a single, dual input OR gate;
a single, dual input NAND gate;
a single, dual input NOR gate;
a single D-type flip flop;
or any combination of single, dual input gates desired.

The binary combination of three control signals for each multiplexer 1506 and 1508 occurring on the S10, S11, S12, S20, S21, S22 control input leads 1514, 1516, 1518, 1520, 1522, and 1524 selects up to eight different inputs for connection to output leads 1436 and 1458. Although FIG. 15 depicts the multiplexers selecting one of only five logic functions, the three control signals could select up to eight logic functions for connection to output leads 1436 and 1458. With multiplexers having more control signal inputs, more logic functions could be included in an IC design and be individually selected by the control signals.

Figure 16:
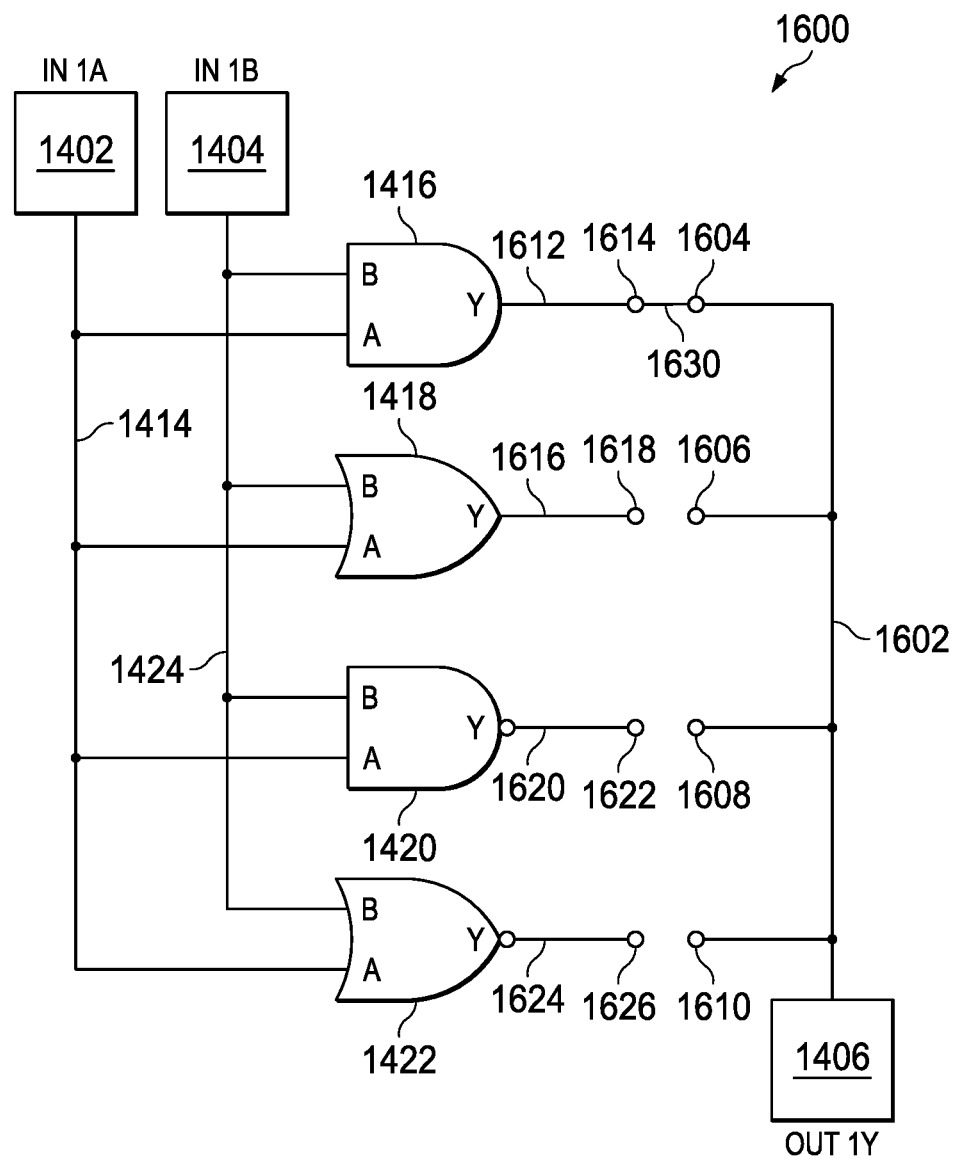
FIG. 16 is partial schematic diagram of an integrated circuit with selectable AND, OR, NAND, and NOR gates of the disclosure using a metal mask.

FIG. 16, in an alternative implementation, depicts a partial schematic diagram of an integrated circuit 1600 with selectable AND, OR, NAND, and NOR gates. IC 1600 is similar to IC 1400 but with alternative open connections between the Y outputs and the 1Y bond pad 1406. One selected open connection is closed with such as a metal mask connection during the manufacturing process.

Lead 1602 connects 1Y bond pad 1406 to open connection terminals 1604, 1606, 1608, and 1610. Lead 1612 connects the Y output of AND gate 1416 to open connection terminal 1614. Lead 1616 connects the Y output of OR gate 1418 to open connection terminal 1618. Lead 1620 connects the Y output of NAND gate 1420 to open connection terminal 1620. Lead 1624 connects the Y output of NOR gate 1422 to open connection terminal 1626.

During a manufacturing step, one of the open connections, formed by the pairs of open connection terminals, is closed to select the finished function for IC 1600. The closing can be implemented by adding a metal or other conductive material strap, such as strap 1630 connecting a pair of open connection terminals.

Figure 17:
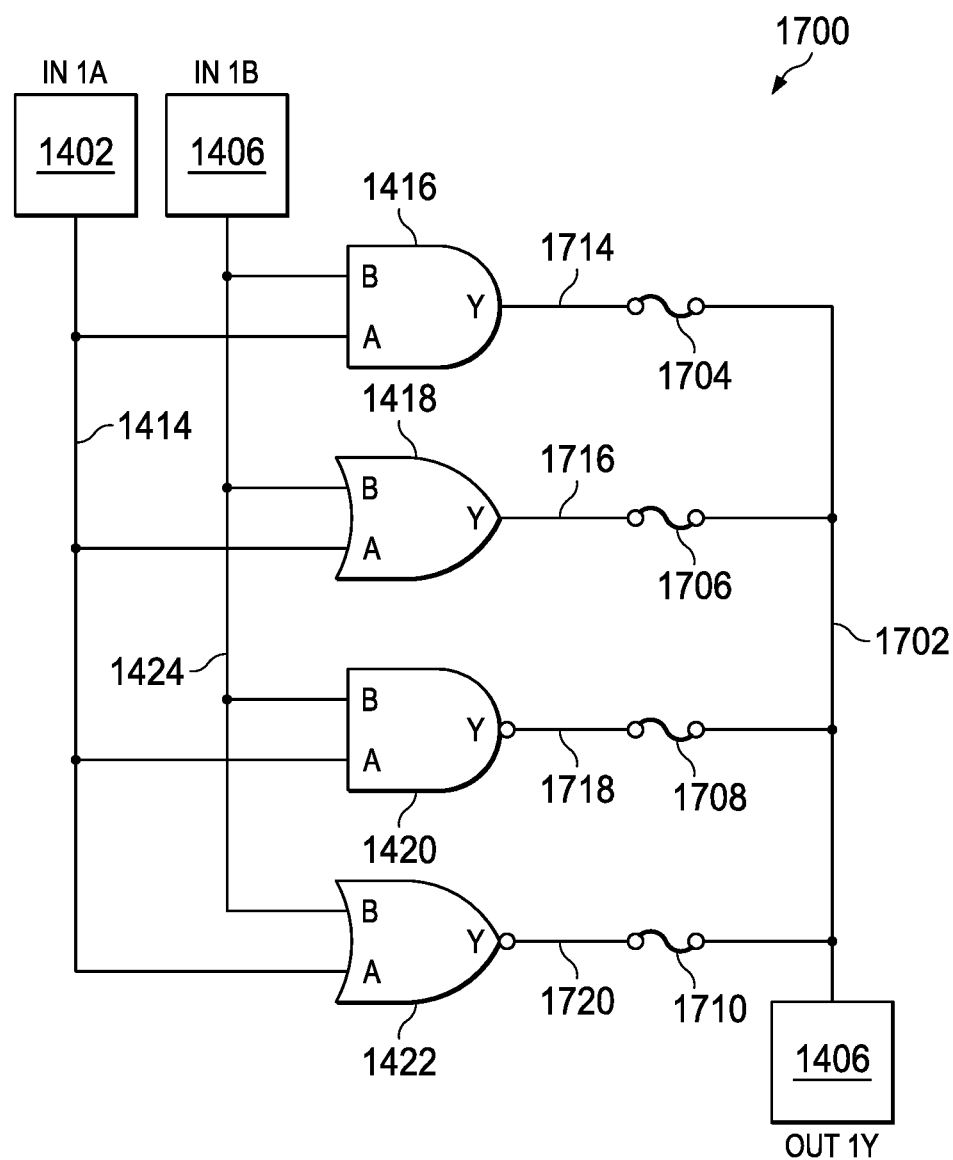
FIG. 17 is partial schematic diagram of an integrated circuit with selectable AND, OR, NAND, and NOR gates of the disclosure using fuses.

FIG. 17, in an alternative implementation, depicts a partial schematic diagram of an integrated circuit 1700 with selectable AND, OR, NAND, and NOR gates. IC 100 is similar to IC 1400 but with fuses between the Y outputs and the 1Y bond pad 1406. One selected open fuse is closed or three selected closed fuses are opened during the manufacturing process.

Lead 1702 connects 1Y bond pad 1406 to one side of fuses 1704, 1706, 1708, and 1710. Lead 1714 connects the Y output of AND gate 1416 to the other side of fuse 1704. Lead 1716 connects the Y output of OR gate 1418 to the other side of fuse 1706. Lead 1718 connects the Y output of NAND gate 1420 to the other side of fuse 1708. Lead 1720 connects the Y output of NOR gate 1422 to the other side of fuse 1710.

Fuses 1704, 1706, 1708, and 1710 can be implemented in either open type or closed type. An open type fuse can be closed in manufacturing with such as a laser beam. A closed type fuse can be opened in manufacturing with such as a laser beam during manufacturing.

During a manufacturing step, one of the open fuses is closed to select the finished function for IC 1700. Alternatively, selected ones of the closed fuses are opened to select the finished function for IC 1700.

Figure 18:
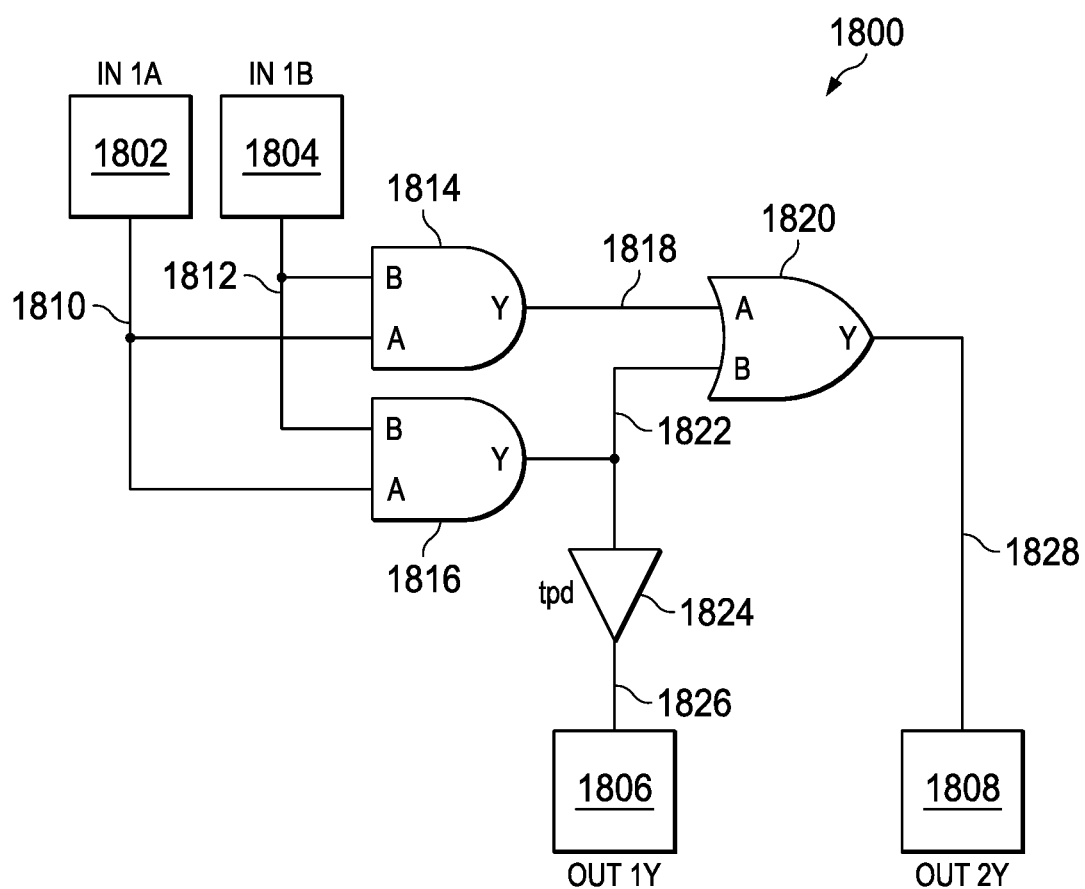
FIG. 18 is a partial schematic diagram of an integrated circuit with two AND gates, an OR gate, and a propagation delay buffer.

FIG. 18, in an alternative implementation, depicts a partial schematic diagram of an integrated circuit 1800 with two AND gates, an OR gate, and a propagation delay buffer.

IC 1800 has a 1A input bond pad 1802, a 1B input bond pad 1804, 1Y output bond 1806, and 2Y output bond pad 1808. Lead 1810 connects the 1A input bond pad 1802 to the A inputs of AND gates 1814 and 1816. Lead 1812 connects the 1B input bond pad to the B inputs of AND gated 1814 and 1816. Lead 1818 connects the Y output of AND gate 1814 to the A input of OR gate 1820. Lead 1822 connects the Y output of AND gate 1816 to the B input of OR gate 1820 and to the input of delay buffer 1824. Lead 1826 connects the output of delay buffer 1824 to the 1Y output bond pad 1806. Lead 1828 connects the Y output of OR gate 1820 to the 2Y output bond pad 1808.

The purpose of the two AND gates and one OR gate is to provide the logical function of the combination. The purpose of the delay buffer 1824 is to provide a propagation delay $t_{pd}$ to the 1Y output bond pad 1806 that approximates the propagation delay $t_{pd}$ to the 2Y output bond pad 1808 introduced by the OR gate 1820. With the delay buffer 1824, the outputs at the 1Y and 2Y bond pads will appear at approximately the same times. In complex functions of the logic circuitry such a delay buffer with a certain propagation delay can be implemented as needed to obtain a desired timing of output signals.

Figure 19:
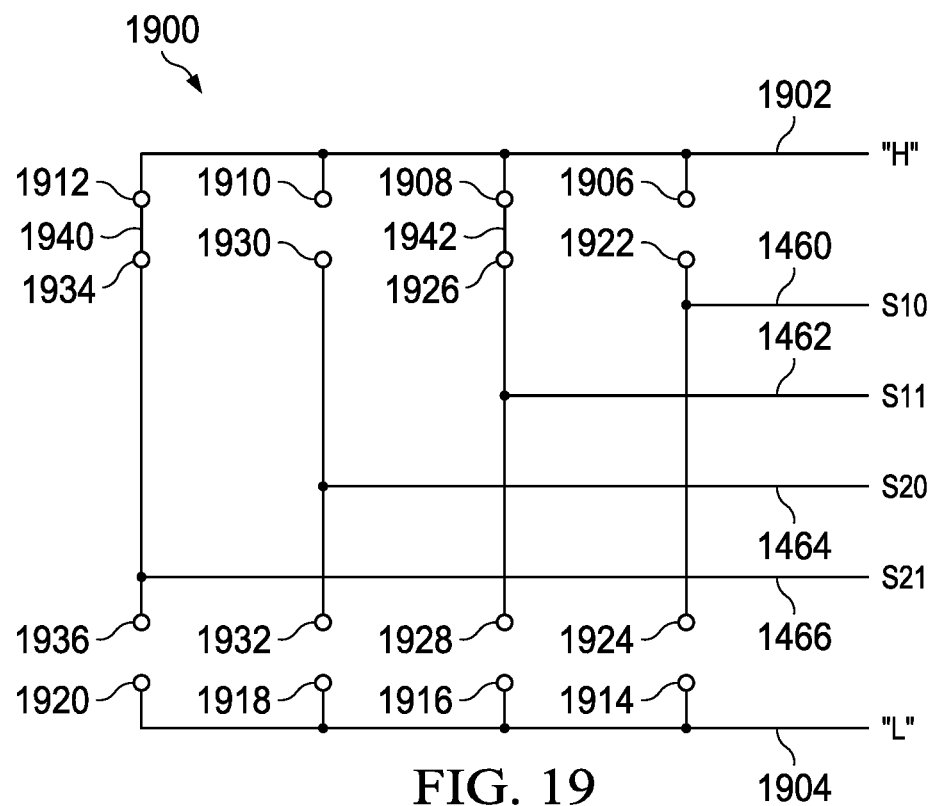
FIG. 19 is a schematic diagram of metal mask connections for multiplex control signals S10, S11, S20, and S21.

FIG. 19 depicts an alternative arrangement 1900 using open connections providing multiplexer control signals S10, S11, S20, and S21 of FIG. 14. Lead 1902 connects a logic "H" to open connection terminals 1906, 1908, 1910, and 1912. Lead 1904 connects a logic "L" to open connection terminals 1914, 1916, 1918, and 1920. S10 lead 1460 connects to open connection terminals 1922 and 1924. S11 lead 1462 connects to open connection terminals 1926 and 1928. S20 lead 1464 connects to open connection terminals 1930 and 1932. S21 lead 1466 connects to open connection terminals 1934 and 1936.

During a manufacturing step, four of the open connections, formed by the pairs of open connection terminals, is closed to select the finished function for an IC. The closing can be implemented by adding a metal or other conductive material strap, such as straps 1940 and 1942 connecting a pair of open connection terminals.

Figure 20:
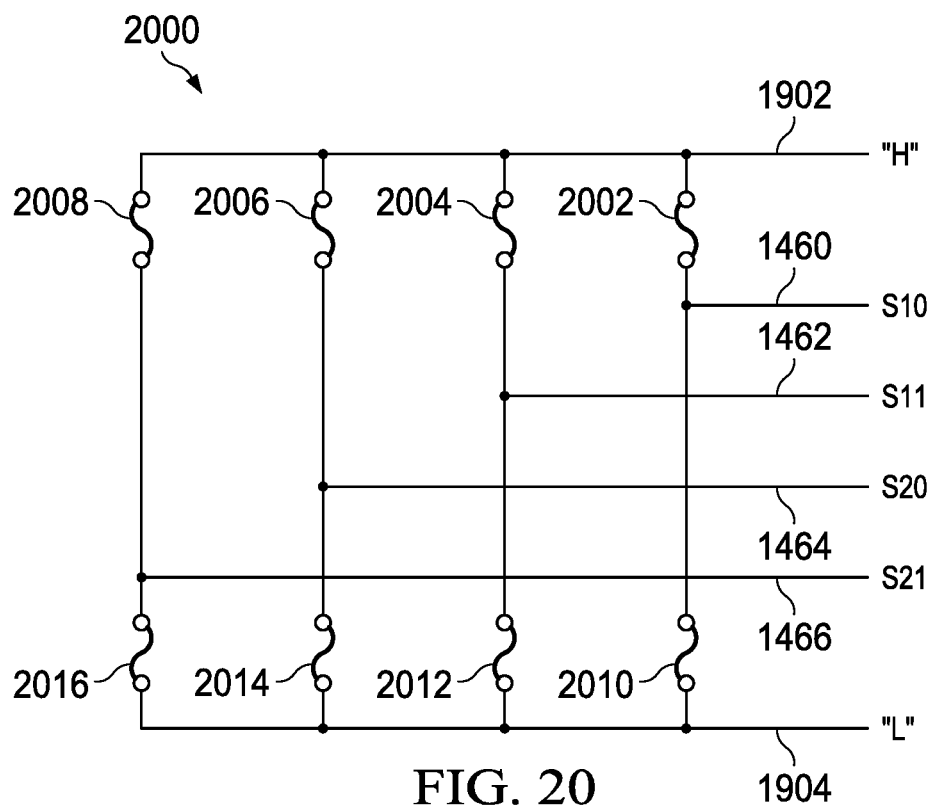
FIG. 20 is a schematic diagram of fuse connections for multiplex control signals S10, S11, S20, and S21.

FIG. 20 depicts an alternative arrangement 2000 using fuses to provide multiplexer control signals S10, S11, S20, and S21. Arrangement 2000 is similar to arrangement 1900, but replacing the open connection terminals with fuses.

Lead 1902 connects a logic "H" to one side of fuses 2002, 2004, 2006, and 2008. Lead 1904 connects a logic "L" to one side of fuses 2010, 2012, 2014, and 2016. S10 lead 1460 connects to the other sides of fuses 2002 and 201. S11 lead 1462 connects to the other sides of fuses 2004 and 2012. S20 lead 1464 connects to the other sides of fuses 2006 and 2014. S21 lead 1466 connects to the other sides of fuses 2008 and 2016.

Fuses 2002 through 2016 can be implemented in either open type or closed type. An open type fuse can be closed in manufacturing with such as a laser beam. A closed type fuse can be opened in manufacturing with such as a laser beam during manufacturing.

During a manufacturing step, four of the open fuses are closed to select the finished function for an IC. Alternatively, selected ones of the closed fuses are opened to select the finished function for an IC.

Figure 21:
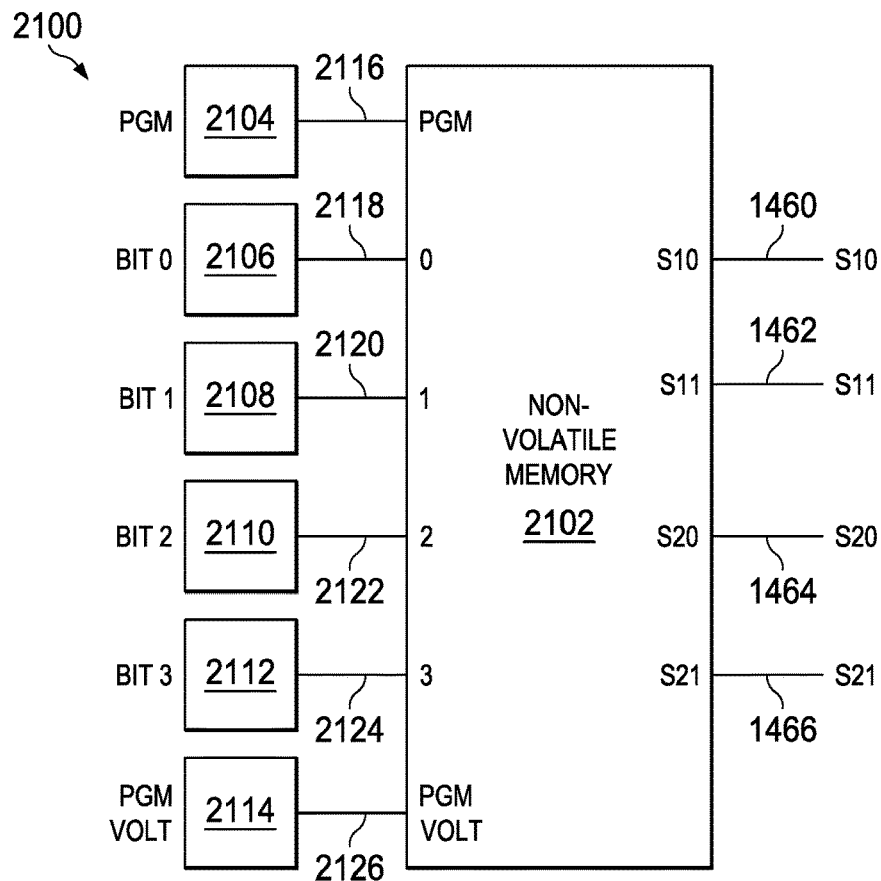
FIG. 21 is a schematic diagram of non-volatile memory providing multiplex control signals S10, S11, S20, and S21.

FIG. 21 depicts an alternative arrangement 2100 using non-volatile memory to provide multiplexer control signals S10, S11, S20, and S21. Arrangement 2100 has a non-volatile memory 2102, program (PGM) input bond pad 2104, BIT 0 input bond pad 2106, BIT 1 input bond pad 2108, BIT 2 input bond pad 2110, BIT 3 input bond pad 2112, and program voltage (PGM VOLT) input bond pad 2114.

Leads 2116 through 2126, respectively, connect the input bond pads 2104 through 2114 to inputs of the non-volatile memory 2102. The S10, S11, S20, and S21 control leads 1460 through 1466 also are connected to outputs of the non-volatile memory 2102.

In operation, non-volatile memory 2102 is programmed to provide a desired control signal on the S10, S11, S20, and S21 outputs. Programming can occur by activating the program input bond pad 2104, providing a programming voltage on input bond pad 2114 and desired programming BITS 0-3 on input bond pads 2106 through 2112. Programming would occur late in the manufacturing process to reduce inventory of differentiated parts. The programming would determine the function of the finished logic part.

Bond pads 2104 through 2114 would not have to be additional bond pads on an integrated circuit but could be the functional input and output bond pads for a finished product that are placed in a programming mode by such as an over voltage on one bond pad. After programming the non-volatile memory, the programming bond pads would revert to normal functional bond pads.

Figure 22:
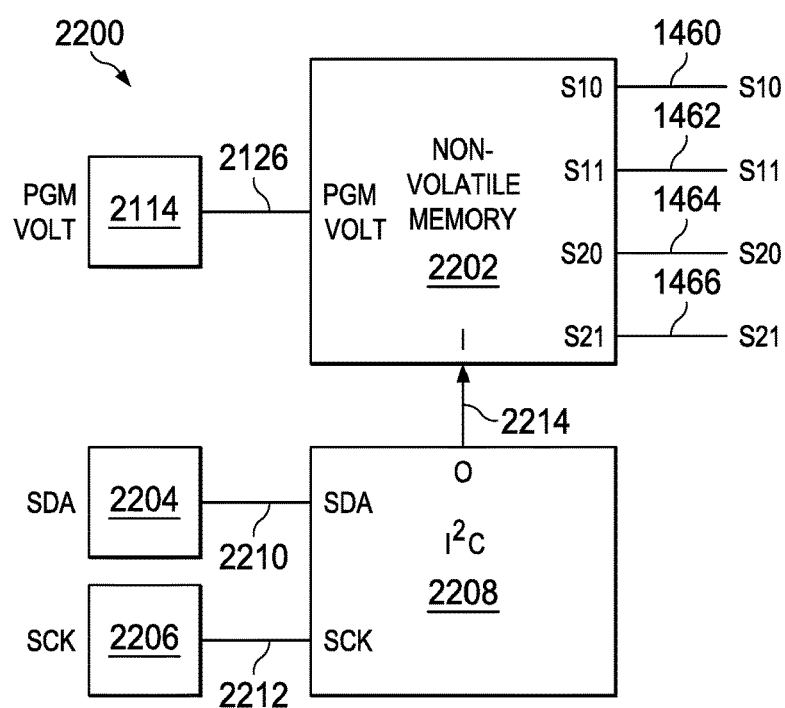
FIG. 22 is a schematic diagram of an I²C serial connection to non-volatile memory providing for multiplex control signals S10, S11, S20, and S21.

FIG. 22 depicts an alternative arrangement 2200 using non-volatile memory and an I²C interface to provide multiplexer control signals S10, S11, S20, and S21. Arrangement 2200 is similar to arrangement 2100, but uses an I²C interface to program the non-volatile memory. Arrangement 2200 has non-volatile memory 2202, an SDA input bond pad 2204, a SCK input bond pad 2206, and an I²C interface circuit 2208.

Lead 2210 connects the SDA input bond pad to the SDA input of the I²C interface circuitry 2208. Lead 2212 connects the SCK input bond pad to the SCK input of the I²C interface circuitry. Lead 2214 connects the O parallel outputs of I²C interface circuitry to the I parallel inputs of non-volatile memory 2202.

In operation, programming bits are transferred into the non-volatile memory 2202 through the I²C interface circuitry over the SDA and SCK input bond pads. Again, bond pads 2114, 2204, 2206 would not have to be additional bond pads on an integrated circuit, but could be the functional input and output bond pads for a finished product that are placed in a programming mode by such as an over voltage on one bond pad. After programming the non-volatile memory, the programming bond pads would revert to normal functional bond pads.

Figure 23:
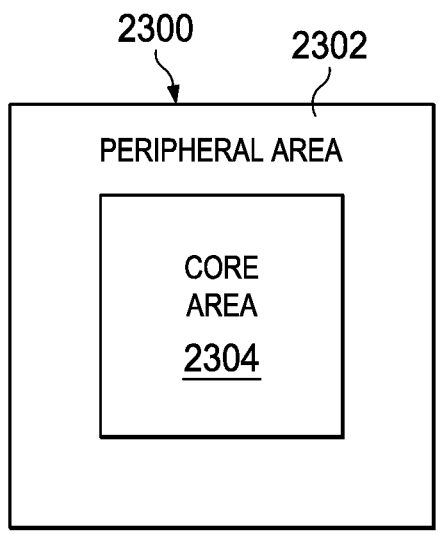
FIG. 23 is a plan view of a semiconductor die depicting a peripheral area for peripheral circuitry and a core area for core circuitry.

FIG. 23 depicts a semiconductor die 2300 having a peripheral area 2302 and a core area 2304.

Figure 24:
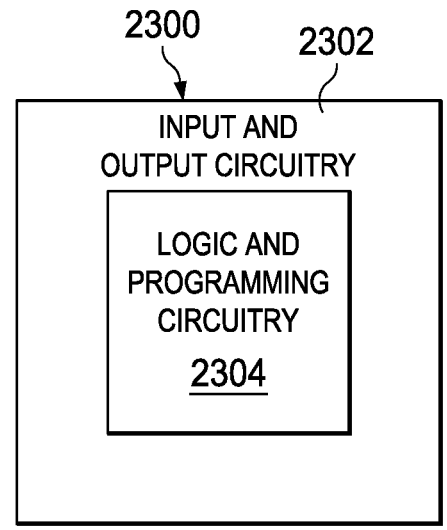
FIG. 24 is a plan view of a semiconductor die depicting input and output circuitry in a peripheral area and logic and programming circuitry in a core area.

FIG. 24 depicts the semiconductor die 2300 as having input and output circuitry in the peripheral area 2302. The input and output circuitry can include input and output bond pads, input circuitry, output circuitry, and ESD protection circuitry. Die 2300 has functional logic and programming circuitry in the core area 2304.

Figure 25:
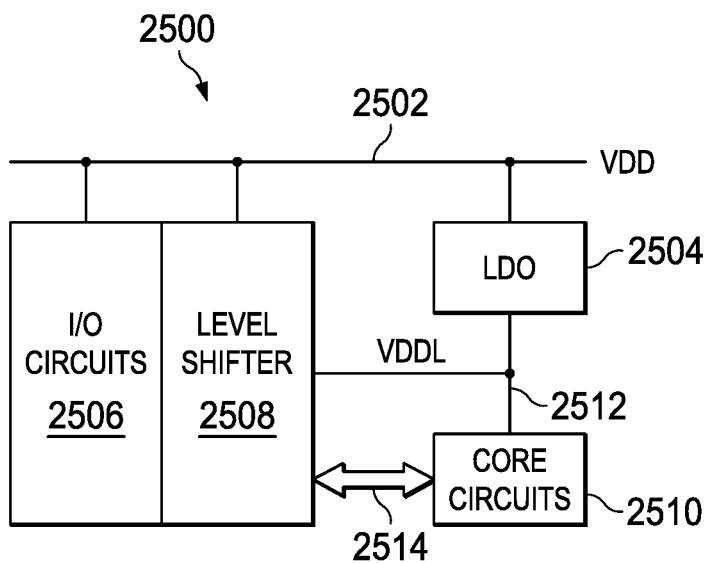
FIG. 25 is a block diagram of a low voltage core, level shifting, and I/O cells.

FIG. 25 depicts an IC 2500 having a VDD voltage source lead 2502, a sub-µA LDO voltage regulator circuit 2504, I/O circuits 2506, level shifter circuits 2508, core circuitry 2510, VDDL low voltage supply lead 2512, and logic connection leads 2514. The LDO voltage regulator circuit receives the VDD supply voltage, such as 3.3 volts, from the source lead 2502 and provides the VDDL low voltage at such as 1.2 volts or 1.8 volts to the core circuits 2510 and the level shifting circuits 2508. The I/O circuits and the level shifter circuits receive the supply voltage VDD from source lead 2502. Logic connections 2514 provide communication between the level shifter circuits 2508 and the core circuits 2510.

In IC 2500, the core circuits 2510 can be implemented in high density, low voltage transistor gates using advanced semiconductor process technologies to include multiple logic functions in one design. Not only does the high density reduce the semiconductor area required for each logic function, the low voltage operation also reduces power consumption, providing further advance in the supply of digital logic function products.

Figure 26:
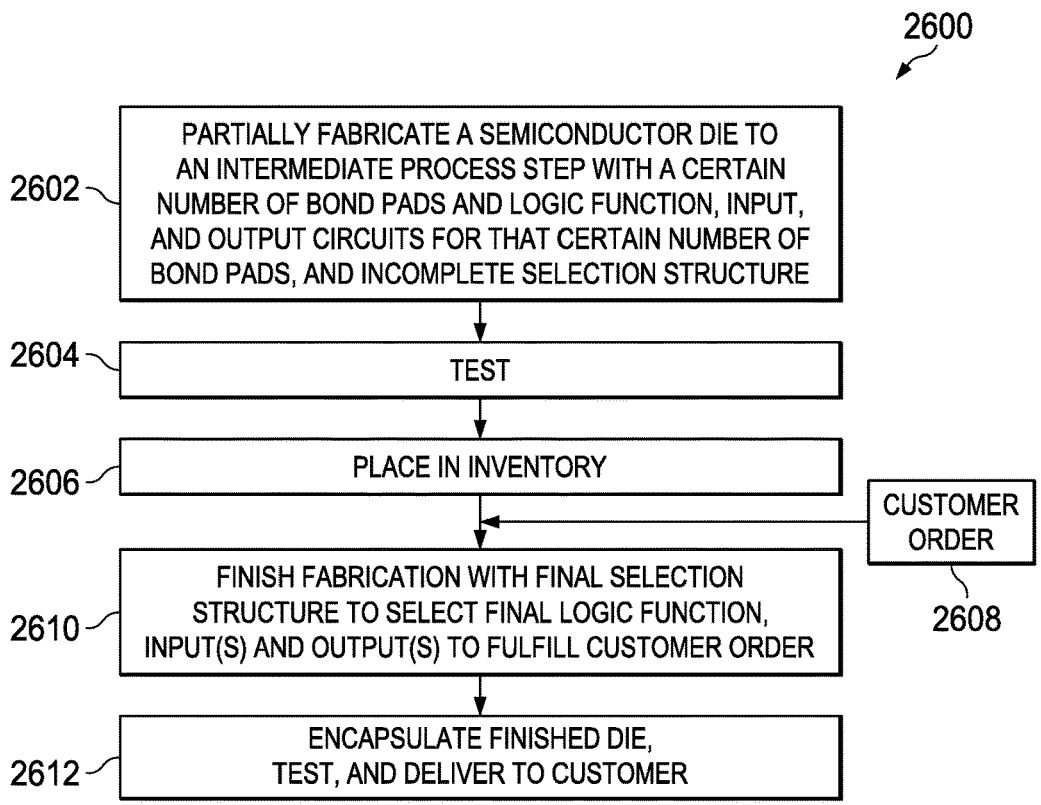
FIG. 26 is a flow chart for one process of making integrated circuits.

In FIG. 26, flow chart 2600 describes one process for making ICs according to the disclosure. In step 2602, the process partially fabricates a semiconductor die to an intermediate process step. The semiconductor die has a certain number of bond pads. The die also has logic function, input, and output circuits for that certain number of bond pads. The die also has incomplete logic function selection structure.

In step 2604, the partially fabricated die is tested. In step 2606 the partially fabricated die is placed in inventory. In step 2608, a customer order for a specific logic function is received.

In step 2610, the process finishes fabricating the semiconductor die with final selection structure to select the specific logic function, input(s), and output(s), from the multiple, available logic function circuits, input circuits, and output circuits in the die to fulfill the customer order. In step 2612 the finished die is encapsulated, tested, and delivered to the customer.

The process of FIG. 26 reduces the inventory of logic function ICs by partially fabricating a semiconductor die for a certain number of bond pads, which limit the smallness of the die or require that the die be of a certain minimum size. The bond pads are fabricated in the peripheral area of the die. The partially fabricated die also includes as many logic function, input, and output circuits as can operate with that certain number of bond pads and as can be fabricated in the core area of the die. The partially fabricated die also includes incomplete selection structure, such as open connections between leads or closed or open fuses.

The partially fabricated die is then tested and placed in inventory. The multiple logic functions available in the partially fabricated die reduce the number of different die that must be kept in inventory.

When a customer order for a specific logic function is received, the partially finished die is removed from inventory and finished with selection structure, such as with the metal layer straps closing the open connections between leads or by opening or closing fuses as was previously described, to obtain the ordered specific logic function. The die is then encapsulated, tested, and delivered to the customer.

Although the description in this disclosure has particularly described open connections, straps, and open or closed fuses as selection structures, these selection structures may be replaced with any structure providing a selectable switch function.

Figure 27:
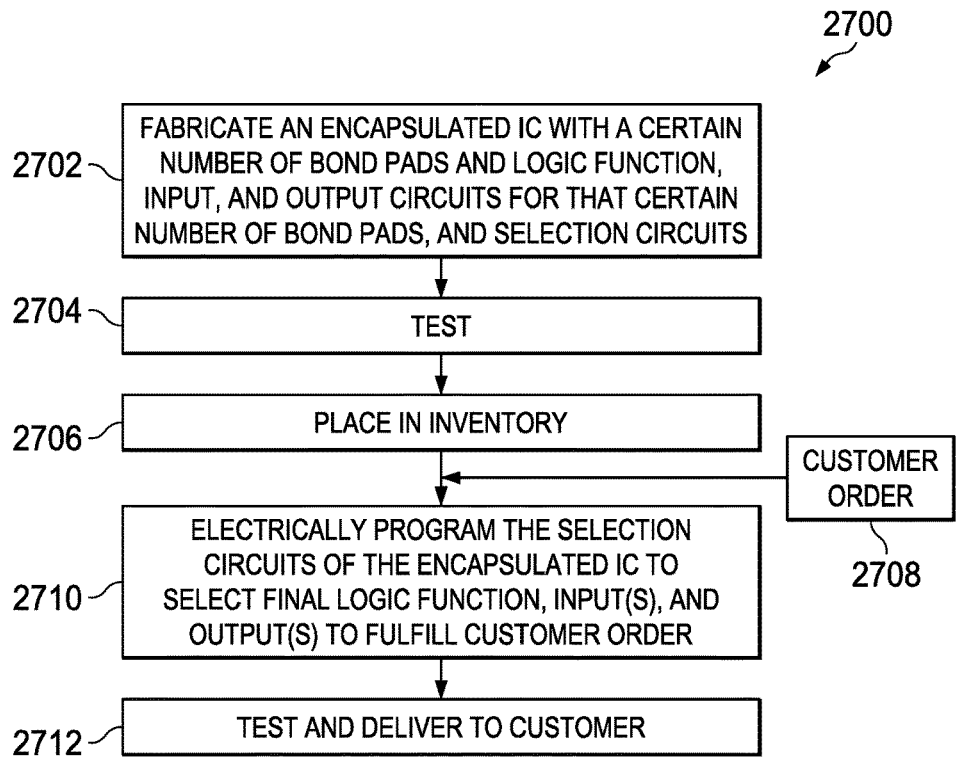
FIG. 27 is a flow chart for another process of making integrated circuits.

In FIG. 27, flow chart 2700 describes another process for making ICs according to the disclosure. In step 2702, the process fabricates an encapsulated IC to have a certain number of bond pads. The die also has logic function, input, and output circuits for that certain number of bond pads. The die also has logic function selection circuits. In step 2704, the encapsulated IC is tested, and in step 2706 the encapsulated IC is placed in inventory. At this step or point, the IC has no logic function at the package pins.

In step 2708, a customer order for a specific logic function is received.

In step 2710, the selection circuits, such as a non-volatile memory using such as a parallel interface or a serial I²C interface, of the encapsulated IC are electrically programmed to select from the multiple, available logic function circuits, input circuits, and output circuits in the die to obtain the logic function to fulfill the customer order. The electrical programming occurs as described earlier concerning the non-volatile memory.

In step 2712, the logic function parts are delivered to the customer.

The process of FIG. 27 reduces the inventory of logic function ICs by fabricating encapsulated ICs having a certain number of bond pads, which limit the smallness of the die or require that the die be of a certain minimum size. The bond pads are fabricated in the peripheral area of the die. The partially fabricated die also includes as many logic function, input, and output circuits as can operate with that certain number of bond pads and as can be fabricated in the core area of the die. The encapsulated IC also includes selection circuits, such as non-volatile memory with a parallel or serial interface.

The encapsulated IC is then tested and placed in inventory. The multiple logic functions available in the IC reduce the number of different ICs that must be kept in inventory. At this step or point, the encapsulated IC provides no logic function.

When a customer order for a specific logic function is received, the encapsulated IC is removed from inventory and the non-volatile memory is electrically programmed as was previously described, to obtain the ordered specific logic function. The programmed IC is then delivered to the customer.

In a broader sense, any mechanical or electrical programming function or structure, other than open connections and straps, fuses, or non-volatile memory, that can be maintained during the life of the IC comes within the scope of this disclosure for selecting a logic function from the available, multiple logic functions of the die or IC.

The figures and text describe simple implementations of the disclosure. More complex combinations and other similar implementations are possible using these examples and explanations.

We claim:

1. An integrated circuit comprising:
   (a) a substrate of semiconductor material having a core area and a peripheral area;
   (b) bond pads formed in the peripheral area, the bond pads including first and second input bond pads and an output bond pad;
   (c) a first set of one or more functional circuits formed in the core area, each functional circuit of the first set having a first function, each functional circuit of the first set having respective first and second inputs coupled to the first and second input bond pads, and having a respective output coupled to the output bond pad;
   (d) a second set of one or more functional circuits formed in the core area, each functional circuit of the second set having a second function different than the first function, each functional circuit of the second set having respective first and second inputs and having a respective output; and
   (e) conductive material coupling the first and second input bond pads to the respective first and second inputs of the one or more functional circuits of the first set and coupling the output bond pad only to the respective output of the one or more functional circuits of the first set.

2. The integrated circuit of claim 1 in which the conductive material includes a strap.

3. The integrated circuit of claim 1 in which the conductive material includes a fuse.

4. The integrated circuit of claim 1 in which the conductive material includes metal.

5. The integrated circuit of claim 1 in which the conductive material includes an upper level metal.

6. The integrated circuit of claim 1 in which the first set of functional circuits includes one or more AND gates.

7. The integrated circuit of claim 1 in which the first set of functional circuits includes one or more OR gates.

8. The integrated circuit of claim 1 in which the first set of functional circuits includes one or more NAND gates.

9. The integrated circuit of claim 1 in which the first set of functional circuits includes one or more NOR gates.

10. The integrated circuit of claim 1 in which the second set of functional circuits includes one or more AND gates.

11. The integrated circuit of claim 1 in which the second set of functional circuits includes one or more OR gates.

12. The integrated circuit of claim 1 in which the second set of functional circuits includes one or more NAND gates.

13. The integrated circuit of claim 1 in which the second set of functional circuits includes one or more NOR gates.

14. The integrated circuit of claim 1 in which the first function is a first digital logic function and the second function is a second digital logic function.

15. The integrated circuit of claim 1 in which the conductive material includes multiplexer circuits coupling the output bond pad to the respective output of the one or more functional circuits of the first set.

16. The integrated circuit of claim 1 in which the conductive material couples the first and second input bond pads to the respective first and second inputs of the one or more functional circuits of the second set.

17. The integrated circuit of claim 1 including a third set of one or more functional circuits formed in the core area, each functional circuit of the third set having a third function different from the first and second functions, each functional circuit of the third set having respective first and second inputs coupled to the first and second input bond pads, and having a respective outputs.

18. The integrated circuit of claim 1 including:
a third set of functional circuits formed in the core area, each functional circuit of the third set having a third function different from the first and second functions, each functional circuit of the third set having respective first and second inputs coupled to the first and second input bond pads, and having a respective output; and
a fourth set of functional circuits formed in the core area, each functional circuit of the fourth set having a fourth function different from the first, second, and third functions, each functional circuit of the fourth set having respective first and second inputs coupled to the first and second input bond pads, and having respective output.

* * * * *